(12) United States Patent
Kido

(10) Patent No.: US 6,380,006 B2
(45) Date of Patent: Apr. 30, 2002

(54) PATTERN FORMATION METHOD AND METHOD OF MANUFACTURING DISPLAY USING IT

(75) Inventor: Shusaku Kido, Kagoshima (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/878,198

(22) Filed: Jun. 12, 2001

(30) Foreign Application Priority Data

Jun. 12, 2000 (JP) .......................................... 2000-175138

(51) Int. Cl.$^7$ .......................... H01L 21/00; H01L 21/84
(52) U.S. Cl. ........................ 438/149; 438/148; 438/155; 438/161
(58) Field of Search ................................. 438/149, 148, 438/155, 161, 760, 758, 713, 725

(56) References Cited

U.S. PATENT DOCUMENTS 5,994,753 A * 11/1999 Nitta ........................... 257/471

FOREIGN PATENT DOCUMENTS

JP 2000-131719 5/2000
JP 2000-133636 5/2000

* cited by examiner

Primary Examiner—Michael S. Lebentritt
Assistant Examiner—Michael K. Luhrs
(74) Attorney, Agent, or Firm—Young & Thompson

(57) ABSTRACT

To obtain a reflowed resist mask 13, organic solvent is infiltrated into a resist mask 7 to reflow the resist mask 7 after first etching using the resist mask 7. As the volume of the resist mask is not reduced, heating is hardly required and in addition, the large viscosity is reduced, the area coated with the resist mask can be increased by a simple method before second etching, in addition, adhesion can be made satisfactory and as a result, wiring 11 having tapered structure can be easily formed.

20 Claims, 29 Drawing Sheets

GATE TERMINAL

DRAIN TERMINAL

GATE TERMINAL

DRAIN TERMINAL

GATE TERMINAL

DRAIN TERMINAL

GATE TERMINAL

DRAIN TERMINAL

GATE TERMINAL

DRAIN TERMINAL

GATE TERMINAL

DRAIN TERMINAL

PATTERN FORMATION METHOD AND METHOD OF MANUFACTURING DISPLAY USING IT

BACKGROUND OF THE INVENTION

1. Field of the Invention

The present invention relates to a pattern formation method for a semiconductor device such as a thin film transistor and a method of manufacturing a display using the pattern formation method, particularly relates to a pattern formation method using technique for reflowing resist and a method of manufacturing a thin film transistor for a display using the pattern formation method.

2. Description of the Prior Art

The advanced integration of a semiconductor device has been achieved by photolithography which is a means for forming a minute pattern and dry etching technique. However, when the performance of a semiconductor device is enhanced as described above, the manufacturing process is advanced and the manufacturing cost is increased.

Then recently, it is demanded to integrate pattern manufacturing processes and to reduce the number of total processes by (1) tapering a wiring pattern which is one of means for making the contents of a process satisfactory and (2) greatly reducing the manufacturing cost of a semiconductor device.

A case that normal wiring is formed instead of tapered wiring (hereinafter called a first conventional example) and a case that wiring in a well-known example is formed (hereinafter called a second conventional example) out of prior art will be described referring to drawings below.

FIGS. 25A to 25D are schematic sectional views showing wiring pattern for explaining the first conventional example n the order of the manufacturing processes.

As shown in FIG.25A, a metallic film 402 made of an aluminum alloy and others is formed on base material 401 such as a glass substrate. The thickness of the metallic film 402 is approximately 1 μm. A resist mask 407 is formed in a predetermined region on the metallic film 402 by well-known photolithography.

Next, as shown in FIG. 25B, the resist mask 407 functions as a mask for etching, first etching is applied to the metallic film 402 and a first tapered layer 415 is formed.

Next, as shown in FIG. 25C, the resist mask 407 reflows by heating the whole at 150 to 200° C. and hangs sideways to be a thermally reflowed resist mask 413.

Next, as shown in FIG. 25D, second etching is applied to the residual metallic film 402 using the thermally reflowed resist mask 413 as an etching mask and wiring 411 having a second tapered layer 416 in the lower part is formed.

FIGS. 26A to 26C are schematic sectional views showing the manufacturing method of the second conventional example (Japanese published unexamined patent application No. 2000-133636) in the order of manufacturing processes.

As shown in FIG. 26A, a metallic film 422 made of an aluminum alloy and others is formed on base material 421. The thickness of the metallic film 422 is approximately 1 μm. A resist mask 427 is formed in a predetermined region on the metallic film 422 by well-known photolithography.

Next, as shown in FIG. 26B, the resist mask 427 functions s a mask for etching, first etching is applied to the metallic film 422 and a first tapered layer 435 is formed.

Next, after the first tapered layer 435 shown in FIG. 26B formed, the resist mask 427 is dipped in organic silane solution which is a sililation reagent together with the base material 421. Or the resist mask 427 is exposed to the vapor of organic silane. As described above, the resist mask 427 is sililated.

The resist mask 427 swells by the sililation and as shown in FIG. 26C, the swollen sililated resist mask 433 is formed. The pattern width of the sililated resist mask 433 swollen by the sililation is increased than the pattern width of the resist mask 427 shown by a broken line. For the sililation reagent, silazane and others are used.

Next, second etching is applied to the residual metallic film 422 using the swollen sililated resist mask 433 as an etching mask and wiring 431 having a second tapered layer 436 in the lower part is formed. However, as the adhesion strength of the swollen sililated resist mask 433 is weak, the first tapered layer 435 is etched from the side and a side-etched part 432 in a crooked shape may be formed in the first tapered layer 435. As a result, the wiring 431 is formed.

A present case of the formation of wiring for which the reduction of the number of manufacturing processes is demanded (hereinafter called a third conventional example) and a case of the formation of wiring in which the number of the manufacturing processes is reduced according to the demand (hereinafter called a fourth conventional example) out of the prior art will be described referring to drawings below.

FIGS. 27A to 27C are schematic sectional views showing the manufacturing process of a part of reverse staggered-type TFT for explaining the third conventional example.

As shown in FIG. 27A, a gate electrode 442 is formed on base material 441 formed by a transparent substrate made of glass and others, a gate insulating film 443, an amorphous silicon (a-Si) film 444, an N+-type amorphous silicon (N+-type a-Si) film 455 and a metallic film 446 are laminated and further, first resist masks 447 and 448 are formed on the metallic film 446 by well-known photolithography.

Next, as shown in FIG. 27B, the metallic film 446 and the N+-type a-Si film 445 are dry-etched using these first resist masks 447 and 448 as an etching mask.

As a result, a source electrode 451, an ohmic contact layer for the source electrode 449, a drain electrode 452 and an ohmic contact layer for the drain electrode 450 are formed. Afterward, the resist masks 447 and 448 first formed are peeled and removed.

Next, as shown in FIG. 27C, the source electrode 451, the ohmic contact layer 449, the drain electrode 452 and the ohmic contact layer 450 are coated, a part of the surface of the a-Si film 444 is coated and a second resist mask 453 is formed by well-known photolithography.

Next, the a-Si film 444 is etched using the second resist mask 453 as an etching mask and an island layer 454 is formed. The second resist mask 453 is peeled and removed.

As a result, reverse staggered-type TFT is formed. The description of the succeeding processes is omitted, however, for example, a pixel electrode, a passivation insulating film and others are formed and an active matrix TFT-LCD device is formed.

FIGS. 28A to 28C are schematic sectional views showing the manufacturing process of a part of reverse staggered-type TFT for explaining the fourth conventional example disclosed in Japanese published unexamined patent application No. 2000-133636. FIG. 28A is similar to FIGS. 27A and 27B related to the third conventional example.

Next, resist masks 467 and 468 are dipped in the solution of organic silane. Or they are exposed to the vapor of organic silane. As a result, the resist masks 467 and 468 are sililated. The resist masks 467 and 468 are swollen by the sililation and as shown in FIG. 28B, they are united to be one swollen sililated resist mask 473. In the swelling in this case, the dimension of the resist masks 467 and 468 respectively shown by a broken line is respectively swollen by the volume of 0.1 to 2.0 $\mu$m Next, second etching is applied using the swollen sililated resist mask 473 as an etching mask and an a-Si film 464 is etched.

As a result, as shown in FIG. 28C, an island layer 471 is formed. Afterward, the swollen sililated resist mask 473 is peeled and removed.

As a result, reverse staggered-type TFT is formed. The description of the succeeding processes is omitted, however, for example, a pixel electrode, a passivation insulating film and others are formed and active matrix TFT-LCD device is formed.

FIGS. 29A to 29C are schematic sectional views showing the manufacturing process of a part of reverse staggered-type TFT for explaining a fifth conventional example disclosed in Japanese published unexamined patent application No. 2000-131719. FIG. 29A is similar to FIGS. 27A and 27B related to the third conventional example.

Next, resist masks 487 and 488 reflow by heating the whole at 150 to 250 ° C. as in the first conventional example and hang sideways to be thermally reflowed resist masks 493 and 494. In this case, the resist masks can be united by extending processing time in case distance L between channels is up to 0.1 to 2.0 $\mu$m, however, as the viscosity of reflowing is high, which is a defect of thermal reflowing, the thermally reflowed resist masks respectively have the wavy uneven end, the unity of the resists is often incomplete and further, as thermal reflowing itself in case the distance between the channels exceeds 2.0 $\mu$m is mostly impossible even by greatly extending processing time, the thermally reflowed resist masks 493 and 494 may not be completely united as shown in FIG. 29B. When an a-Si film 484 under the resist masks is etched in a state that the unity of the resist masks is insufficient and adhesion between each resist mask and the film under it is unsatisfactory, a united island layer is not formed as shown in FIG. 29C to be isolated island layers 495 and 496 and a TFT channel is not normally formed.

As described above, reverse staggered-type TFT is formed. The description of the succeeding processes is omitted, however, for example, a pixel electrode, a passivation insulating film and others are formed and active matrix TFT-LCD device is formed, however, the distance L between channels which can form TFT elements by thermal reflowing in the fifth conventional example is limited to 0.1 to 2.0 $\mu$m or less.

In the case of the first conventional example shown in FIGS. 25A to 25D that the wiring pattern is tapered out of the above-described prior art, the volume is reduced because the evaporation of components inside the resist is also accelerated in the thermal reflowing of the resist mask 407. As the swelling of the dimension in the lateral direction of the resist mask 407 is approximately 0.5 to 2.0 $\mu$m and in addition, the viscosity of thermal reflowing is high, the end of the resist mask is wavy and uneven, side etching often occurs and wiring has an insufficiently tapered shape, that is, the cross section of wiring is often perpendicular or partly reversely tapered.

The above-mentioned second conventional example was proposed to solve a defect in the first conventional example by utilizing the swelling of the volume of the resist. In that respect, large effect is acquired. However, these inventors found a phenomenon that when the resist mask is swollen too much, adhesion strength between the swollen resist and the film under it (the etched film) is reduced and as a result, side etching may occur by further experiments. In the experiments, a result that no problem occurs even if the resist is expanded laterally up to 0.1 to 2.0 $\mu$m utilizing the swelling of the volume is acquired and no problem occurs in a normal range, however, when the resist is further expanded, the above-mentioned problems are required to be considered.

Next, the third conventional example shown in FIGS. 27A to 27C for reducing the number of manufacturing processes out of the prior art has a problem that two photolithographic processes are required to form the source electrode 451, the ohmic contact layer for the source electrode 449, the drain electrode 452 and the ohmic contact layer for the drain electrode 450 and to form the island layer 454 in the manufacture of the staggered-type TFT.

The above-mentioned fourth conventional example also utilizes the same principle as in the first conventional example and has a problem that the fourth conventional example is enabled only if an interval between the source electrode and the drain electrode of a TFT device is 0.1 to 2.0 $\mu$m or less and when the interval is 4 $\mu$m or more, the unity of the resist masks is practically difficult because of the above-mentioned reason.

The above-mentioned fifth conventional example also utilizes the same principle as in the second conventional example, in the fifth conventional example, the unity is enabled by extending processing time in case distance between channels is 0.1 to 2.0 $\mu$m, however, as the viscosity of thermal reflowing is high, which is a defect of thermal reflowing, the end is wavy and uneven, the unity of the resists is also often incomplete and further, as thermal reflowing itself in case the distance between channels exceeds 2.0 $\mu$m is mostly impossible even if processing time is greatly extended, a case that the resists are not completely united may occur. As the unity of the resist masks is insufficient and adhesion between each resist mask and the film under it is unsatisfactory, the united island layer is not formed, isolated island layers are formed and the TFT channel is not normally formed.

Therefore, there is a problem that the distance between channels which can form TFT elements by thermal reflowing in the fifth conventional example is limited to 0.1 to 2.0 $\mu$m or less and in addition, the TFT elements are often incomplete.

SUMMARY OF THE INVENTION

An object of the invention is to provide a method of forming a pattern of a semiconductor device wherein patterns different in size which heretofore require two processes can be formed in one process.

To achieve the object, in the invention, a chemical for fusing resist is infiltrated into the resist, the resist is fused by the chemical and is reflowed (called reflowing by a chemical).

That is, in the pattern formation method of forming a desired pattern using processing for etching a film, after a resist film is formed on the etched film, the resist film is patterned so that it is a first mask, next, the film to be etched is etched using the first mask and next, after the first mask is reflowed by a chemical and a second mask is formed, etching is continued using the second mask.

In this case, the whole one layer is etched by first etching, a different layer under it may be also etched by second etching or one layer is etched up to the halfway by first etching and the rest may be also etched by second etching.

The above-described problems are solved by the above-mentioned method. That is, in the second conventional example, as only the swelling of the volume of resist is utilized, a problem of the adhesion strength between the resist and the etched layer occurs and in the invention, as reflowing is utilized, the problem of the second conventional example is solved.

The pattern formation method according to the invention includes a process for forming an organic film having a predetermined pattern on an etched film, a process for removing a part of the etched film from the surface using the organic film as a mask so that the etched film has an exposed region and a coated region coated with the organic film, a process for transforming and extending the organic film up to the exposed region and a process for etching the exposed region of the etched film using the transformed organic film as a mask and has a basic concept that the process for forming the transformed organic film is executed by reflowing by infiltrating the solution of an organic solvent into the organic film and fusing the organic film. The pattern formation method having the basic concept of the invention is embodied in the following various embodiments.

First, in the process for forming an organic film, adjacent organic films adjacent to each other are formed, in the process for forming a transformed organic film, the adjacent organic films respectively become an adjacent transformed organic film and are united.

Between the process for forming the transformed organic film and the process for etching the exposed region of the etched film, the process for removing a part of a transformed organic film is included and is executed by reducing the area of the transformed organic film by ashing by applying oxygen to the transformed organic film or ozone processing using ultraviolet radiation.

Processes from the process for forming the transformed organic film to the process for etching the exposed region of the etched film are repeated at least once after the process for etching the exposed region of the etched film.

Out of the etching of the etched film, at least the last etching is wet etching.

The solution of an organic solvent includes at least one of the following organic solvents.
Organic solvents (R: alkyl group or substitutional alkyl group, Ar: phenyl radical or aromatic nucleus except phenyl radical)

Alcohols (R—OH)

Alkoxy alcohols

Ethers (R—O—R, Ar—O—R, Ar—O—Ar)

Esters

Ketones

Glycols

Alkylene glycols

Glycol ethers

Reflowing is executed by exposing to the vapor of the solution of the organic solvent or by dipping in the solution of the organic solvent.

The organic film is composed of plural organic films different in the thickness, when the organic film is a photosensitive organic film, the plural organic films different in the thickness are acquired by varying the quantity of exposure to the photosensitive organic film, concretely, between the process for forming the organic film by plural organic films different in the thickness and removing a part of the etched film from the surface using the organic film as a mask so that the etched film has an exposed region and a coated region coated with the organic film and the process for transforming the organic film and extending it to the exposed region, a process for removing the relatively thinner organic film out of the plural organic films different in the thickness forming the organic film by etching the organic film and leaving the organic film thicker than the relatively thinner organic film is included and further concretely, between the process for removing apart of the etched film from the surface using the organic film as a mask so that the etched film has the exposed region and the coated region coated with the organic film and the process for transforming the organic film and extending it to the exposed region, a process for removing an altered layer of the surface of the organic film is included. Further, the process for removing the altered layer of the surface of the organic film is executed by processing the organic film by plasma processing or UV ozone processing, the plasma processing is executed using any of plasma processing gas including $O_2$ gas, plasma processing gas including fluorine gas and plasma processing gas including mixed gas of $O_2$ gas and fluorine gas, when plasma processing gas including fluorine gas is used, it includes any of $SF_6$, $CF_4$ and $CHF_3$ and when plasma processing gas including mixed gas of $O_2$ gas and fluorine gas is used, it includes any of $SF_6/O_2$, $CF_4/O_2$ and $CHF_3/O_2$.

Between the process for removing a part of the etched film from the surface using the organic film as a mask so that the etched film has an exposed region and a coated region coated with the organic film and the process for transforming the organic film and extending it to the exposed region, a process for dipping the etched film and the organic film in the solution of hydrofluoric acid is included.

The etched film is composed of a first film and a second film in order from the bottom, the second film is etched and removed using the organic film as a mask, the first film is etched and removed using the transformed organic film as a mask, the first film is a first metallic film, the second film is a second metallic film made of material different from that of the first metallic film. Or the first film is a silicon film and the second film is a silicon film for an ohmic contact including high-density impurities and a metallic film in order from the bottom. Or the first film is a silicon film and a silicon film for an ohmic contact including high-density impurities in order from the bottom and the second film is a metallic film. In the latter two cases, the silicon film forms a semiconductor layer of a thin film transistor, and the silicon film for the ohmic contact and the metallic film form a source electrode and drain electrode of the thin film transistor. When the organic film is composed of plural organic films different in the thickness, the organic film is composed of a thicker organic film formed thickly on the side of a channel of the semiconductor layer and a thinner organic film formed thinly on the side apart from the channel of the semiconductor layer, after the source electrode and the drain electrode of the thin film transistor are formed, the organic film is etched from the surface, only the thicker organic film is left on the source electrode and the drain electrode and the thicker organic film is transformed to be a transformed organic film.

For the organic film in the pattern formation method according to the invention, a photoresist film is suitable.

The pattern formation method according to the invention is suitable for the process of an active matrix such as TFT which forms a display such as a liquid crystal display and an EL display.

That is, the manufacturing method of TFT for a display including a process for forming a gate electrode on a substrate, a process for sequentially forming a gate insulating film, a semiconductor layer and a metallic layer so that they cover the gate electrode, a process for patterning the metallic layer and forming a mask for forming a source electrode and drain electrode, a process for infiltrating an organic solvent in the mask after the metallic layer is patterned, reflowing the mask and connecting the mask between the source electrode and the drain electrode and a process for patterning the semiconductor layer using the connected mask acquired in the process for connecting the mask is acquired.

The manufacturing method of TFT for a display further includes a process for forming an ohmic layer between the metallic layer and the semiconductor layer, and the ohmic layer is also patterned in the process for patterning the metallic layer.

Also, the manufacturing method of TFT for a display includes the process for forming the ohmic layer between the metallic layer and the semiconductor layer and is characterized in that the ohmic layer is also patterned in the process for patterning the semiconductor layer and after the connected mask is removed, the ohmic layer is patterned using the source electrode and the drain electrode as a mask.

Furthermore, the manufacturing method of TFT for a display is characterized in that it includes a process for also forming a common electrode on a substrate when the gate electrode is formed and further, includes a process for sequentially forming a gate insulating film, a semiconductor layer and a metallic layer so that they cover the common electrode in a process for sequentially forming the gate insulating film, the semiconductor layer and the metallic layer and forming a pixel electrode located over the common electrode in a process for patterning the metallic layer and forming a source electrode and a drain electrode.

The manufacturing method is characterized in that masks adjacent so that they respectively correspond to a source electrode and a drain electrode have a thin film region in which the masks are thinner on the far side than the thickness on the adjacent sides.

A case that the pattern formation method according to the invention is applied to a liquid crystal display will be described below.

The manufacturing method of a first liquid crystal display according to the invention is characterized in that TFT is formed by the manufacturing method including a process for forming gate. wiring and a gate electrode on a first substrate and next, forming a gate insulating film for covering the gate wiring and the gate electrode on the first substrate, a process for depositing a semiconductor film, a semiconductor film for an ohmic contact and a metallic film for a source and a drain on the gate insulating film in order from the bottom, a process for forming a resist mask for the source electrode and a resist mask for the drain electrode respectively located over the gate electrode on the metallic film for the source and the drain, a process for etching the metallic film for the source and the drain and the semiconductor film for an ohmic contact using the resist mask for the source electrode and the resist mask for the drain electrode as a mask and forming a laminated pattern composed of the semiconductor film for an ohmic contact and the metallic film for the source and the drain, a process for connecting the resist mask for the source electrode and the resist mask for the drain electrode by reflowing the resist mask for the source electrode and the resist mask for the drain electrode sideways and covering at least a part of the laminated pattern with a connected resist mask and a process for etching the semiconductor film using the connected resist mask as a mask and forming a semiconductor island, next, opposite substrates are formed by arranging a second substrate opposite to the first substrate on the side of the semiconductor island of the first substrate, and further, a liquid crystal composition is filled between TFT and the opposite substrate. The manufacturing method is also characterized in that the process for forming the connected resist mask is executed by infiltrating the solution of an organic solvent into the resist mask for the source electrode and the resist mask for the drain electrode and reflowing the resist mask for the source electrode and the resist mask for the drain electrode.

Next, the manufacturing method of a second liquid crystal display according to the invention is characterized in that TFT is formed by a manufacturing method including a process for forming gate wiring and a gate electrode on a first substrate and next, forming a gate insulating film for covering the gate wiring and the gate electrode on the first substrate, a process for depositing a semiconductor film, a semiconductor film for an ohmic contact and a metallic film for a source and a drain on the gate insulating film in order from the bottom, a process for forming a resist mask for a source electrode and a resist mask for a drain electrode respectively located over the gate electrode on the metallic film for the source and the drain, a process for etching the metallic film for the source and the drain using the resist mask for the source electrode and the resist mask for the drain electrode as a mask and forming a metallic film pattern for the source electrode and a metallic film pattern for the drain electrode, a process for connecting the resist mask for the source electrode and the resist mask for the drain electrode by reflowing the resist mask for the source electrode and the resist mask for the drain electrode sideways and covering at least a part of the metallic film pattern for the source electrode and the metallic film pattern for the drain electrode with a connected resist mask, a process for etching the semiconductor film for an ohmic contact and the semiconductor film using the connected resist mask as a mask and forming a semiconductor film laminated island, a process for etching the semiconductor film for an ohmic contact of the semiconductor film laminated island using the metallic film pattern for the source electrode and the metallic film pattern for the drain electrode as a mask after the connected resist mask is peeled, forming a laminated pattern composed of the semiconductor film for an ohmic contact and the metallic film for the source and the drain and forming a semiconductor island composed of the semiconductor film, next, a second substrate opposite to the first substrate is arranged on the side of the semiconductor island of the first substrate, and further, a liquid crystal composition is filled between TFT and the opposite substrate. The manufacturing method is also characterized in that the process for forming the connected resist mask is executed by infiltrating the solution of an organic solvent into the resist mask for the source electrode and the resist mask for the drain electrode and reflowing the resist mask for the source electrode and the resist mask for the drain electrode.

Next, the manufacturing method of a third liquid crystal display according to the invention is characterized in that TFT is formed by a manufacturing method including a process for forming gate wiring and a comb-type common electrode on a first substrate and next, forming a gate insulating film for covering the gate wiring and the common electrode on the first substrate, a process for depositing a semiconductor film, a semiconductor film for an ohmic contact and a metallic film for a source and a drain on the gate insulating film in order from the bottom, a process for forming a resist mask for a source electrode and a resist mask for a drain electrode respectively located over the gate wiring on the metallic film for the source and the drain and forming a resist mask for a pixel electrode so that an electrode is formed between comb-type electrodes of the common electrode, a process for etching the metallic film for the source and the drain and the semiconductor film for an ohmic contact using the resist mask for the source electrode, the resist mask for the drain electrode and the resist mask for a pixel electrode as a mask, forming a source electrode laminated pattern composed of the semiconductor film for an ohmic contact and the metallic film for the source and the drain, a drain electrode laminated pattern and a pixel electrode laminated pattern and forming the pixel electrode laminated pattern so that at least comb-type electrodes of the pixel electrode laminated pattern are respectively put between the comb-type electrodes of the common electrode, a process for connecting at least the resist mask for the source electrode and the resist mask for the drain electrode by reflowing the resist mask for the source electrode, the resist mask for the drain electrode and the resist mask for a pixel electrode sideways and covering at least a part of the laminated pattern with a connected resist mask, a process for etching the semiconductor film using the connected resist mask as a mask and forming a semiconductor island, next, a second substrate opposite to the first substrate is arranged on the side of the semiconductor island of the first substrate, and further, a liquid crystal composition is filled between TFT and the opposite substrate. The manufacturing method is also characterized in that the process for forming the connected resist mask is executed by infiltrating the solution of an organic solvent into the resist mask for the source electrode and the resist mask for the drain electrode and reflowing the resist mask for the source electrode, the resist mask for the drain electrode and the resist mask for a pixel electrode.

In the manufacturing methods of the first, second and third liquid crystal displays according to the invention, the process for forming the resist mask for the source electrode and the resist mask for the drain electrode is executed by forming a thicker resist mask on the side on which the resist mask for the source electrode and the resist mask for the drain electrode are opposite on the metallic film for the source and the drain and forming a thinner resist mask thinner than the thicker resist mask on the side on which the resist mask for the source electrode and the resist mask for the drain electrode mutually separate, the process for forming the connected resist mask is executed by reflowing the thicker resist mask and the thinner resist mask, the expansion in the lateral direction of the connected resist mask is large in the vicinity of a channel region between the resist mask for the source electrode and the resist mask for the drain electrode, the expansion in the lateral direction of the connected resist mask is gradually reduced as the connected resist mask separates from the channel region, a process for etching the resist mask for the source electrode and the resist mask for the drain electrode, removing only the thinner resist mask and leaving at least the thicker resist mask is included immediately before the process for forming the connected resist mask between the process for forming the resist mask for the source electrode and the resist mask for the drain electrode and the process for forming the connected resist mask, and the process for forming the connected resist mask is executed by reflowing the left resist mask and forming the connected resist mask. Further, these connected resist masks are formed in a shape such as each connected resist mask covers at least the channel region between the resist mask for the source electrode and the resist mask for the drain electrode.

Also, in the manufacturing methods of the first, second and third liquid crystal displays according to the invention, after the process for forming the semiconductor island, a process for forming a passivation insulating film for covering the a laminated pattern and the semiconductor island on the gate insulating film, a process for piercing the passivation insulating film and the gate insulating film on the gate wiring, piercing the passivation insulating film on the laminated pattern and respectively forming a contact hole for the gate wiring and a contact hole for the source and the drain and a process for forming gate wiring terminal electrode and an upper electrode for the source and the drain respectively connected to the gate wiring and the laminated pattern on the passivation insulating film via the contact hole for the gate wiring and the contact hole for the source and the drain continue.

Also, in the manufacturing methods of the first, second and third liquid crystal displays according to the invention, the gate metallic film and the metallic film for the source and the drain respectively forming the gate wiring and the gate electrode are any of the following metallic films.

ITO film

Indium-tin alloy

One-layer structure made of aluminum or aluminum alloy

One-layer structure made of chromium or chromium alloy

Two-layer structure composed of one layer made of aluminum or aluminum alloy and other layer made of chromium or chromium alloy Two-layer structure composed of one layer made of aluminum or aluminum alloy and other layer made of titanium or titanium alloy Two-layer structure composed of one layer made of aluminum or aluminum alloy and other layer made of titanium nitride or titanium nitride alloy Two-layer structure composed of one layer made of aluminum or aluminum alloy and other layer made of molybdenum or molybdenum alloy Two-layer structure composed of one layer made of chromium or chromium alloy and other layer made of molybdenum or molybdenum alloy Three-layer structure composed of first and third layers made of chromium or chromium alloy and second layer made of aluminum or aluminum alloy Three-layer structure composed of first and third layers made of molybdenum or molybdenum alloy and second layer made of aluminum or aluminum alloy Three-layer structure made of aluminum or aluminum alloy, molybdenum or molybdenum alloy and chromium or chromium alloy Three-layer structure made of aluminum or aluminum alloy, molybdenum or molybdenum alloy and titanium or titanium alloy Three-layer structure made of aluminum or aluminum alloy, titanium nitride or titanium nitride alloy and titanium or titanium alloy

DETAILED DESCRIPTION OF THE PREFERRED EMBODIMENTS

Figure 1A:
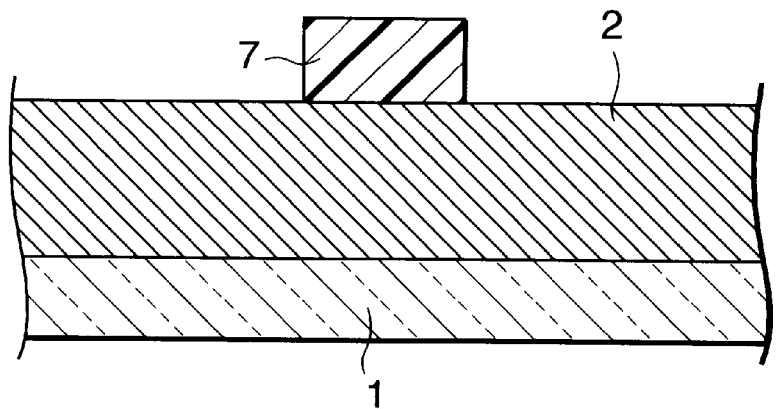
FIGS. 1A to IC are schematic sectional views showing a first embodiment of the invention in the order of manufacturing processes.
Figure 1B:
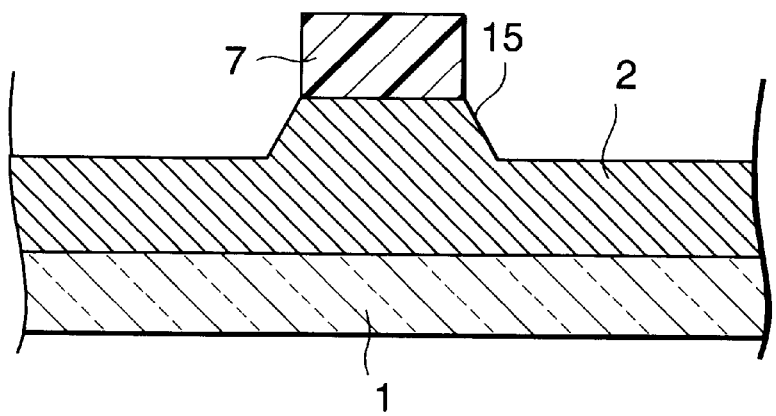
Figure 1C:
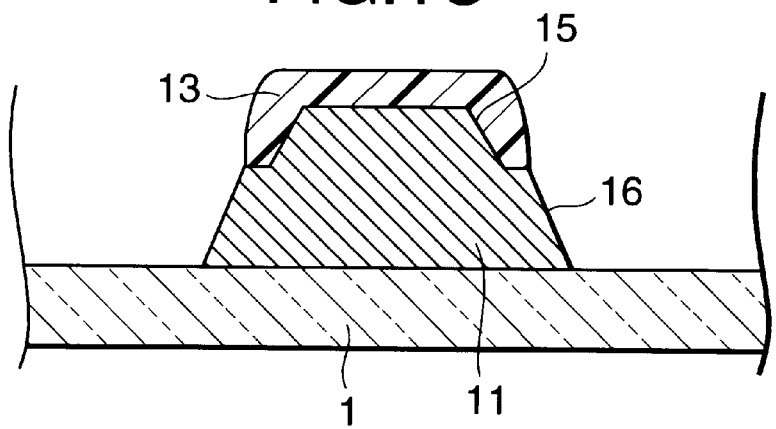

Referring to FIGS. 1A to 1C, a first embodiment of the invention will be described below. The first embodiment is a basic embodiment of embodiments described below and FIGS. 1 are schematic sectional views showing a method of forming a wiring pattern equivalent to this embodiment in the order of processes.

According to the first embodiment of the invention, as shown in FIG. 1A, a metallic film 2 made of an alloy of aluminum and copper is formed on base material 1 as described in the item of the prior art. The thickness of the metallic film 2 is approximately 1 $\mu$m. A resist mask 7 is formed in a predetermined region of the metallic film 2 by well-known photolithography. In this embodiment, the base material 1 is used under the metallic film 2, however, the base material may be also an insulating film such as a transparent substrate made of glass and others, an amorphous silicon film, a silicon oxide film and a silicon nitride film respectively used for a liquid crystal display and a silicon oxide film and a silicon nitride film respectively used for a semiconductor integrated circuit.

Next, as shown in FIG. 1B, the resist mask 7 functions as a mask for etching, first etching is applied to the metallic film 2 and a first tapered layer 15 is formed. In the above-mentioned etching, plasma etching using chlorine and oxygen as reacting gas is executed and the cross section of formed wiring is tapered.

Next, after the first tapered layer 15 is formed, the resist mask 7 is exposed to the vapor of a chemical (that is, including at least one of the solution of an organic solvent, alkaline solution and acid solution) or is dipped in a chemical of extremely dilute concentration (for example, 1/100 to 1/1000) together with the base material 1.

An example using the solution of an organic solvent as a chemical is shown below, however, alkaline solution and acid solution may be also used.

In case the resist mask is exposed to the vapor of the solution of an organic solvent, the vapor density in the exposure has an effect and in case the temperature of the organic solvent and the base material is both ordinary temperature (around 20° C.) and acetone and propylene glycol monoethyl ether which are respectively high in the vapor density are used, the resist mask is exposed to the vapor for 0.1 to 3 minutes, however, in case tripropylene glycol monoethyl ether and N-methyl-2 pyrolidone which are respectively low in the vapor density are used, 5 to 20 minutes may be also required. When the temperature of an organic solvent and base material rises, processing time is extended, when their temperature lowers, processing time is reduced and desired reflowing is achieved in short exposure to the vapor.

In the latter processing by dipping in the solution of the organic solvent of extremely dilute concentration, the concentration of the organic solvent in the solution is required to be regulated so that it is extremely dilute so as to prevent resist from being dissolved and peeled because the resist is dissolved in the solution of the organic solvent and is peeled when the concentration of the organic solvent is high and in addition, so as to infiltrate a part of the organic solvent in the resist.

In this embodiment, for the organic solvent, acetone, propylene glycolmonoethyl ether, tripropylene glycolmonoethyl ether and N-methyl-2-pyrolidone are used, however, an organic solvent including at least of one of the following organic solvents can be applied as a transformed example of this embodiment and the following embodiments are also alike Organic solvents are shown below in a state in which they are classified into organic solvents as a high-order concept and concrete organic solvents as a low-order concept (R: alkyl group or substitutional alkyl group, Ar: phenyl radical or aromatic nucleus except phenyl radical).
Organic solvents:
- Alcohols (R—OH)
- Alkoxy alcohols
- Ethers (R—O—R, Ar—O—R, Ar—O—Ar)
- Esters
- Ketones
- Glycols
- Alkylene glycols
- Glycol ethers Concrete examples of the above organic solvents:
- $CH_3OH$, $C_2H_5OH$, $CH_3(CH_2)_xOH$
- Isopropyl alcohol (IPA)
- Ethoxyethanol
- Methoxyalcohol
- Long chained alkylester
- Monoethanolamine (MEA)
- Acetone
- Acetylacetone
- Dioxane
- Ethyl acetate
- Butyl acetate
- Toluene
- Methyl ethyl ketone (MEK)
- Dimethyl sulfoxide (DMSO)
- Methyl isobutyl ketone (MIBK)
- Butylcarbitol
- n-butyl acetate (nBA)
- Gamma butyrolactone
- Ethyl cellosolve acetate (ECA)
- Ethyl lactate
- Ethyl pyruvate
- 2-heptanone (MAK)
- 3-methoxybutyl acetate
- Etylene glycol
- Propylene glycol
- Butylene glycol
- Ethylene glycol monoethyl ether
- Diethylene glycol monoethyl ether
- Ethylene glycol monoethyl ether acetate
- Ethylene glycol monomethyl ether
- Ethylene glycol monomethyl ether acetate
- Ethylene glycol mono-n-butyl ether
- Polyethylene glycol
- Polypropylene glycol
- Polybutylene glycol
- Polyethylene glycol monoethyl ether
- Polydiethylene glycol monoethyl ether
- Polyethylene glycol monoethyl ether acetate
- Polyethylene glycol monomethyl ether
- Polyethylene glycol monomethyl ether acetate
- Polyethylene glycol mono-n-butyl ether
- Methyl-3-methoxypropionate (MMP)
- Propylene glycol monomethyl ether (PGME)
- Propylene glycol monomethyl ether acetate (PGMEA)
- Propylene glycol monopropyl ether (PGP)
- Propylene glycol monoethyl ether (PGEE)
- Ethyl-3-ethoxypropionate (FEP)
- Dipropylene glycol monoethyl ether
- Tripropylene glycol monoethyl ether
- Polypropylene glycol monoethyl ether
- Propylene glycol monomethyl ether propionate
- 3-methoxy-methyl propionate
- 3-ethoxy-ethyl propionate
- N-methyl-2-pyrolidone (NMP)

For reflowing using a chemical, a method of mainly exposing to the vapor of the solution of an organic solvent will be described below.

Figure 24:
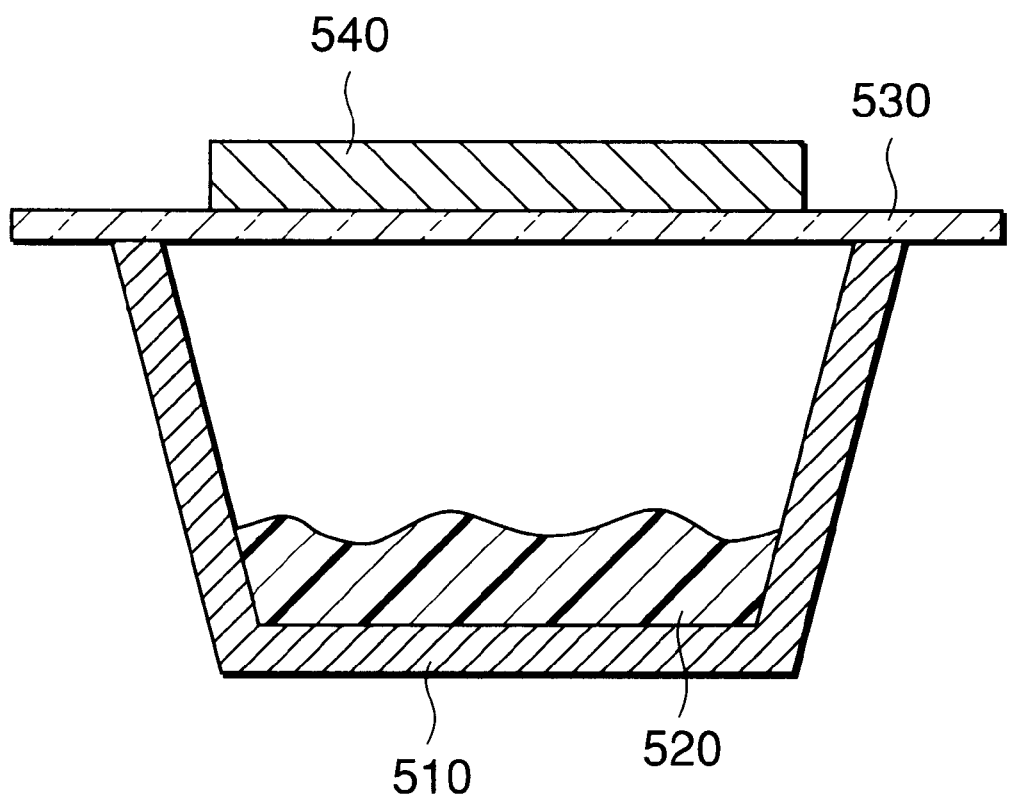
FIG. 24 is a schematic sectional view showing a reflowing device used in the embodiments of the invention.

For a concrete example of this processing method, as shown in FIG. 24, an organic solvent 520 such as N-methyl-2 pyrolidone is poured up to the depth of 5 to 15 mm in a stainless butt 510 20 mm deep, a substrate 530 is put on the butt 510 with the processing surface of the substrate turned over and further, a dead weight 540 is put on the substrate 530 to seal the vapor atmosphere of the organic solvent 520 in space between the stainless butt 510 and the substrate 530. The temperature of the substrate 530 and the organic solvent 520 shall be kept at ordinary temperature (around 20° C.). As described above, the processing substrate 530 is exposed to the vapor of the organic solvent. In case acetone and propylene glycol monoethyl ether which are respectively high in the vapor density are used, the processing substrate is exposed to the vapor for 0.1 to 3 minutes, however, in case tripropylene glycol monoethyl ether and N-methyl-2-pyrolidone which are respectively low in the vapor density are used, the processing substrate is exposed to the vapor for 5 to 20 minutes.

Figure 25A:
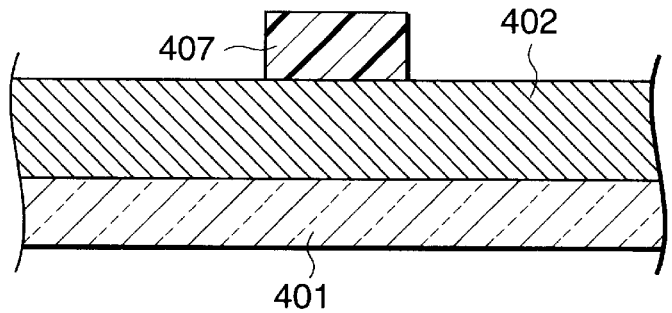
FIGS. 25A to 25D are schematic sectional views showing manufacturing processes in a first conventional example.
Figure 25B:
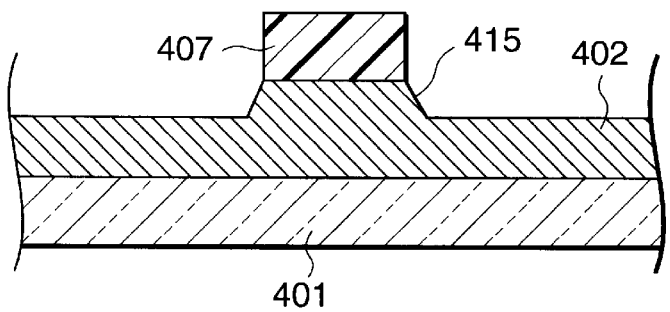
Figure 25C:
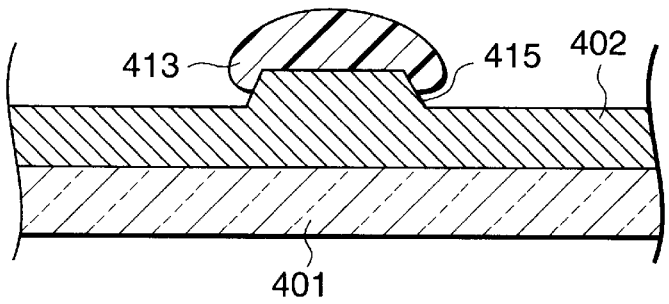
Figure 25D:
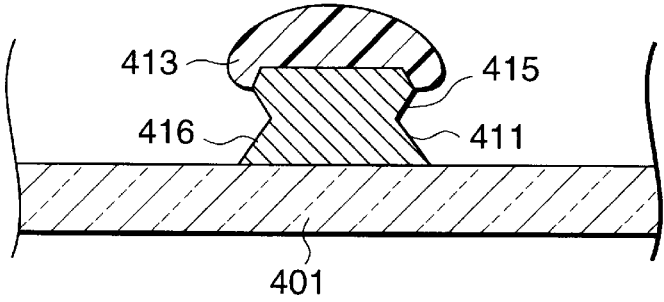
Figure 26A:
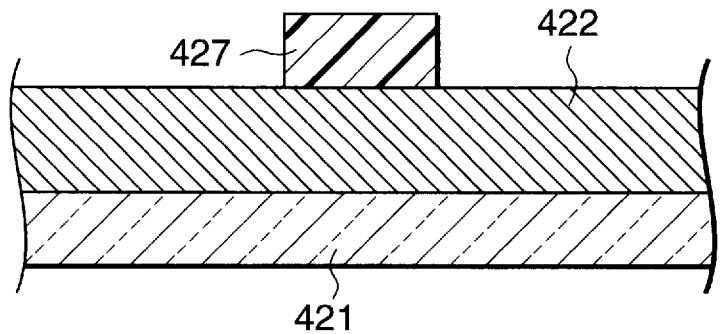
FIGS. 26A to 26C are schematic sectional views showing manufacturing processes in a second conventional example.
Figure 26B:
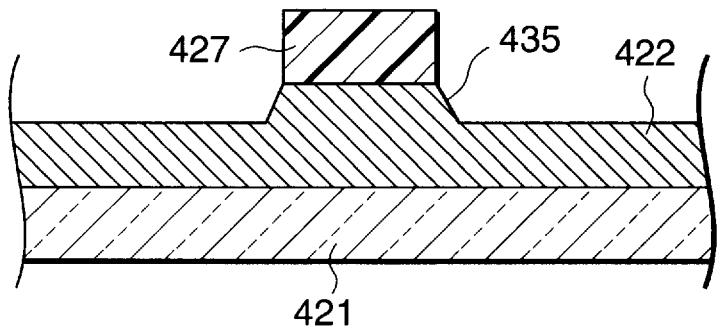
Figure 26C:
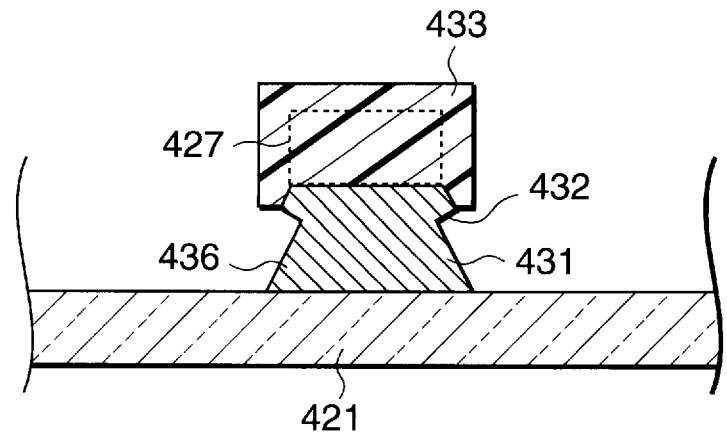
Figure 27A:
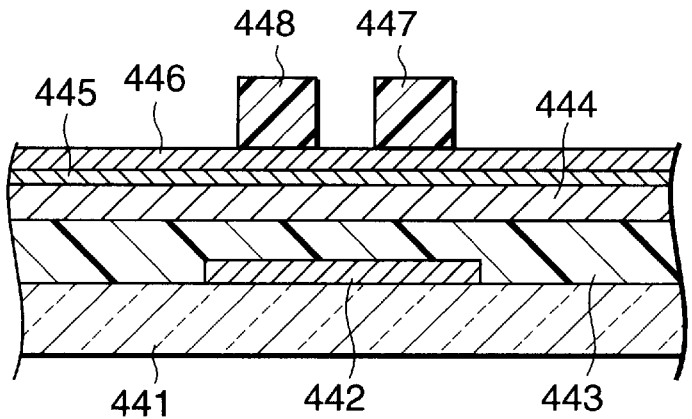
FIGS. 27A to 27C are schematic sectional views showing manufacturing processes in a third conventional example.
Figure 27B:
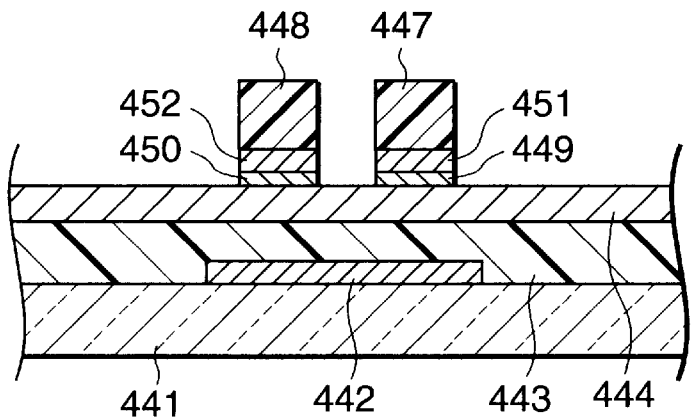
Figure 27C:
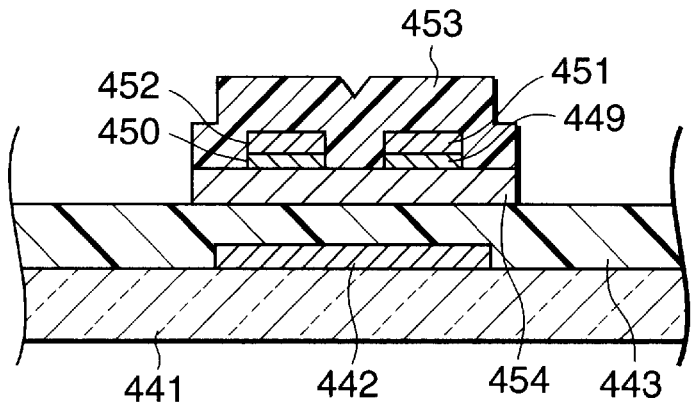
Figure 28A:
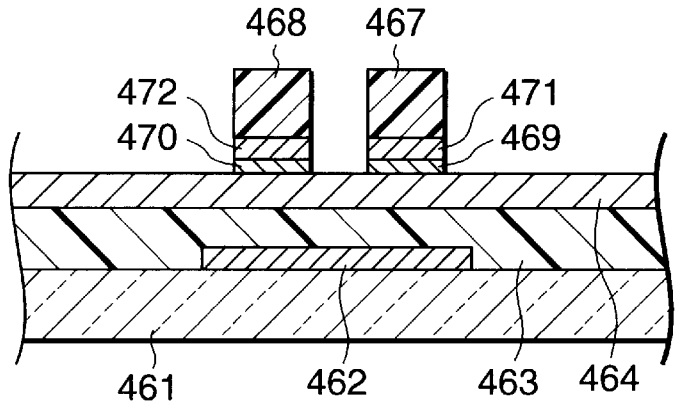
FIGS. 28A to 28C are schematic sectional views showing manufacturing processes in a fourth conventional example.
Figure 28B:
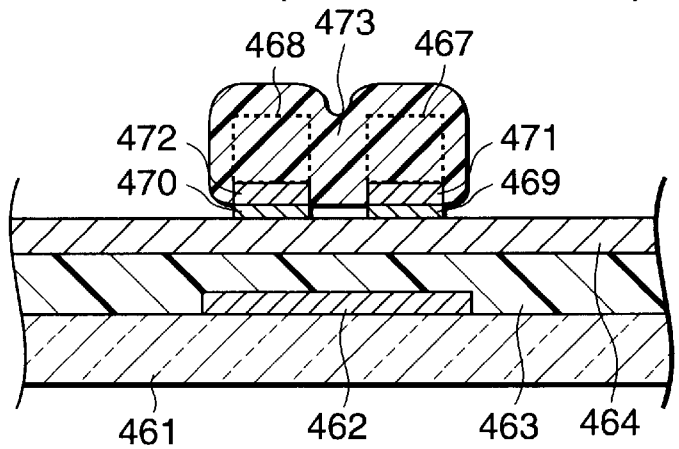
Figure 28C:
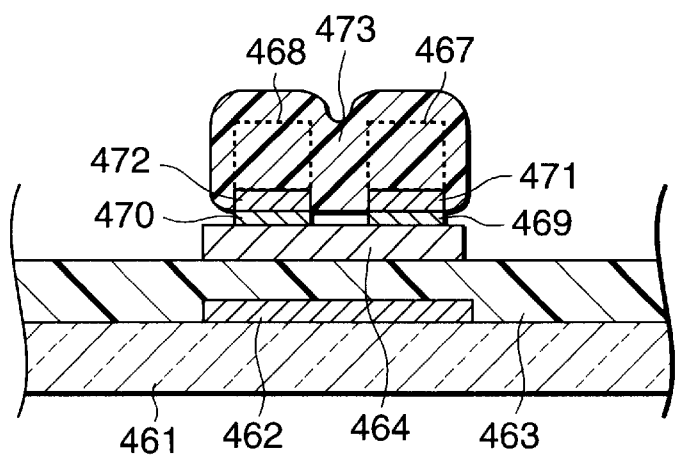
Figure 29A:
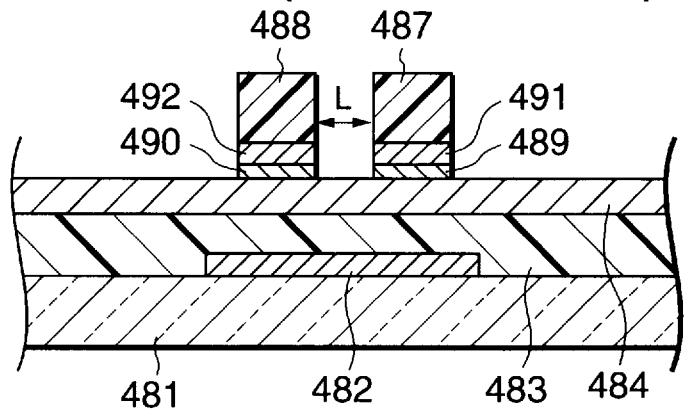
FIGS. 29A to 29C are schematic sectional views showing manufacturing processes in a fifth conventional example.
Figure 29B:
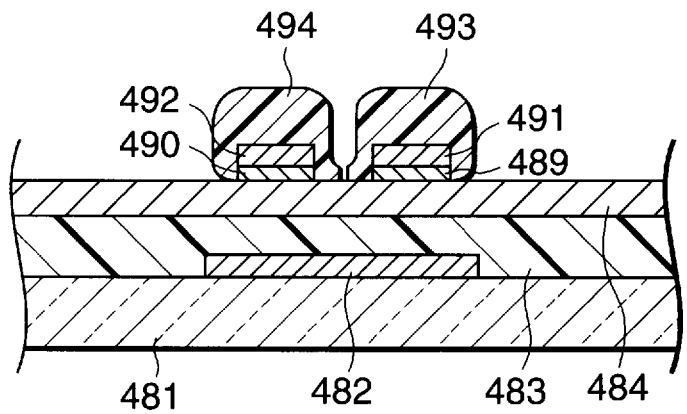
Figure 29C:
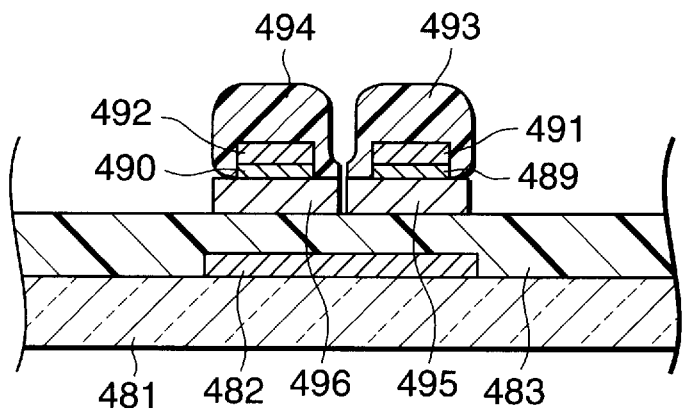

In a state in which the solution of the above chemical, that is, an organic solvent is infiltrated into resist, a phenomenon that the resist fuses, reflowing (reflowing by a chemical) occurs and when the supply of the chemical is stopped, the organic solvent in the resist is evaporated within a few tens seconds to a few minutes (depending upon the type of the organic solvent) and the resist is set occurs. It is also found that as the chemical infiltrates while the resist is fused, the resist is swollen, however, after the chemical is evaporated, the volume is reduced. The resist reflows in reflowing by the chemical and expands sideways as shown in FIG. 1C. As the viscosity of resist is lower in reflowing by a chemical, compared with the above-mentioned thermal reflowing, the first tapered layer 15 is completely coated as shown in FIG. 1C in the invention and further, a part of the metallic film 2 which is the residual etched film is also coated. In the meantime, thermal reflowing often forms the structures shown in FIGS. 25C and 25D. The resist can reflow sideways by approximately 10 μm un der a processing condition that the resist is exposed to the vapor of the solution of an organic solvent such as acetone and propylene glycol monoethyl ether which are respectively high in the vapor density for three minutes at 20° C. and by 20 µm or more under a processing condition that the resist is exposed for five minutes or more. Desired reflowed distance can be achieved in extended processing time when the temperature of the organic solvent and that of the base material in this case are high and in reduced processing time when they are low.

Heating at 100 to 200° C. may be also executed for 5 to 60 minutes before etching processing after reflowing by a chemical so as to enhance adhesion strength between the resist and the film under it after reflowing by the chemical.

Next, second etching is applied to the residual metallic film 2 using the reflowed resist mask 13 as an etching mask and a second tapered layer 16 is formed. In this case, plasma etching using chlorine, oxygen and others as reacting gas is also executed. A part of the cross section of formed wiring 11 has a step, however, as a whole, the wiring has a tapered shape.

In the first embodiment, the case that the metallic film 2 is etched by the first and second etching is described, however, the invention is not limited to such a method.

The metallic film may be also composed of laminated two or more types instead of one type of metallic film, in that case, the material of an upper layer out of the laminated films of the resist mask is first etched and the material of a lower layer is etched after reflowing. In this case, in one photolithographic process, two types of patterns are formed.

To accelerate the reflowing of the resist mask, after the first etching process, oxygen plasma processing, that is, processing in the plasma of RF power of 1000 W at the flow rate of $O_2$ of 300 sccm under 100 Pa is executed for 120 seconds to remove a layer altered by first etching of the surface of the resist mask after the first etching process. Or UV ozone processing, that is, processing for heating the base material at 100 to 200° C. and radiating UV light in the atmosphere of ozone gas may be also executed. The altered resist superficial layer is removed by the processing and uniform reflowing small in difference between the inside and the outside is performed.

In the first conventional example (thermal reflowing by heating) out of the prior art, as the reduction of the volume by the evaporation of a solvent by heating prevents the expansion of the planar dimension in reflowing and the viscosity in reflowing is related to heating temperature, the heating temperature is required to be raised to lower the viscosity and increase expansion, however, the rise of the heating temperature also causes the reduction of the volume. Therefore, for the method of realizing tapering by extending the planar dimension on of the resist according to the invention, the first conventional example is disadvantageous in that heating to some extent is required and in addition, the volume of the resist is reduced.

In the meantime, in the first embodiment of the invention, as the volume is not reduced, heating is hardly required and in addition, the large viscosity can be lowered because of reflowing by infiltrating a solvent and others in the resist mask, the planar dimension of the resist mask can be extended by a simple method before second etching, in addition, adhesion can be kept and as a result, tapered wiring can be easily formed. Hereby, the problem of the first conventional example is completely solved.

Next, referring to FIGS. 2 and 3, a second embodiment of the invention will be described. FIGS. 2 and FIGS. 3 are respectively schematic sectional views showing the manufacturing process of a part of staggered-type TFT according to the invention.

Figure 2A:
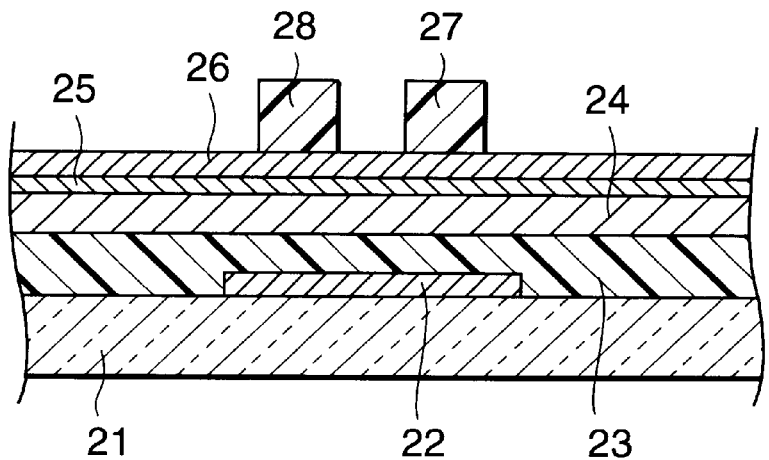
FIGS. 2A to 2C are schematic sectional views showing a second embodiment of the invention in the order of manufacturing processes.

As shown in FIG. 2A, as in the third conventional example, a gate electrode 22 is formed on base material 21 formed by a transparent substrate made of glass and others, and a gate insulating film 23 having the thickness of 350 nm, an a-Si film 24 having the thickness of 200 nm, an N+-type a-Si film 25 having the thickness of 50 nm and a metallic film 26 made of a Cr—Al alloy and others having the thickness of 250 nm are laminated.

Next, resist masks 27 and 28 are formed on the metallic film 26 by well-known photolithography. The metallic film 26 and the N+-type a-Si film 25 are dry-etched using the resist masks 27 and 28 as a mask for first etching.

Figure 2B:
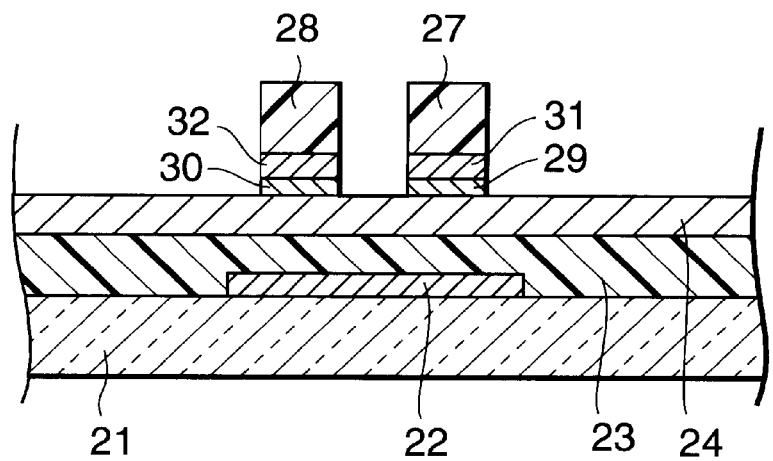

As a result, as shown in FIG. 2B, an ohmic contact layer for a source electrode 29, the source electrode 31, an ohmic contact layer for a drain electrode 30 and the drain electrode 32 are formed.

Figure 2C:
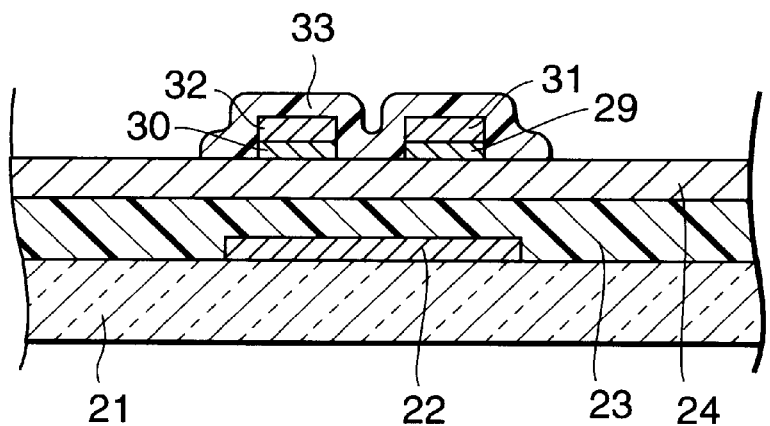

Next, as described in relation to the first embodiment, the resist masks 27 and 28 are exposed to the vapor of an organic solvent of acetone for 1 to 3 minutes together with the base material 21. Hereby, acetone gradually infiltrates into the resist masks 27 and 28 and the resist masks are reflowed (hereinafter called reflowing by a chemical). Each area of the resist masks 27 and 28 is expanded by processing for reflowing the resist masks and as shown in FIG. 2C, a sa result of reflowing, the resist masks 27 and 28 become a reflowed resist mask 33 in which adjacent parts are united.

As the viscosity is low in this reflowing, the reflowed resist mask 33 completely covers the ohmic contact layer 29, the source electrode 31, the ohmic contact layer 30 and the drain electrode 32 respectively formed by first etching and further, also covers a part of the surface of the a-Si film 24 under them. It is verified that in this reflowing, distance between channels can be extended up to maximum 20 µJm depending upon a processing condition.

To accelerate the reflowing of the resist masks, after the first etching process, oxygen plasma processing, that is, processing in plasma having RF power of 1000 W at the flow rate of $O_2$ of 300 sccm under 100 Pa is executed for 120 seconds to remove an altered layer by first etching of the surface of the resist mask or UV ozone processing, that is, processing for heating the base material at 100 to 200 ° C. and radiating UV radiation in the atmosphere of ozone gas may be also executed. The altered resist superficial layer is removed by the processing and uniform reflowing small in difference between the inside and the outside is executed. The above-mentioned oxygen plasma processing and UV ozone processing have effect that the wettability of the surface of the film uncoated with resist is improved and also have effect that the surface of the film is easily reflowed by fused resist.

Furthermore, to improve only the wettability of undercoating (in the second embodiment, the a-Si film and the metallic film) before reflowing by a chemical, a method of smoothing the surface of the film or making the surface hydraulic before reflowing by a chemical can be given by (1) dipping the base material in the solution of hydrofluoric acid, (2) processing the surface with plasma ($O_2$, fluoric gas ($SF_6$, $CF_4$, $CHF_3$ and others) or fluoric gas and oxygen ($SF_6/O_2$, $CF_4/O_2$, $CHF_3/O_2$ and others) and (3) etching the upper film only by wet etching instead of dry etching.

Preparation and the selection of conditions before reflowing by a chemical are performed if necessary by measuring the ratio of removing an altered layer of the surface of the resist and the ratio of improving the wettability of the surface of the film reflowed by a chemical.

Figure 3A:
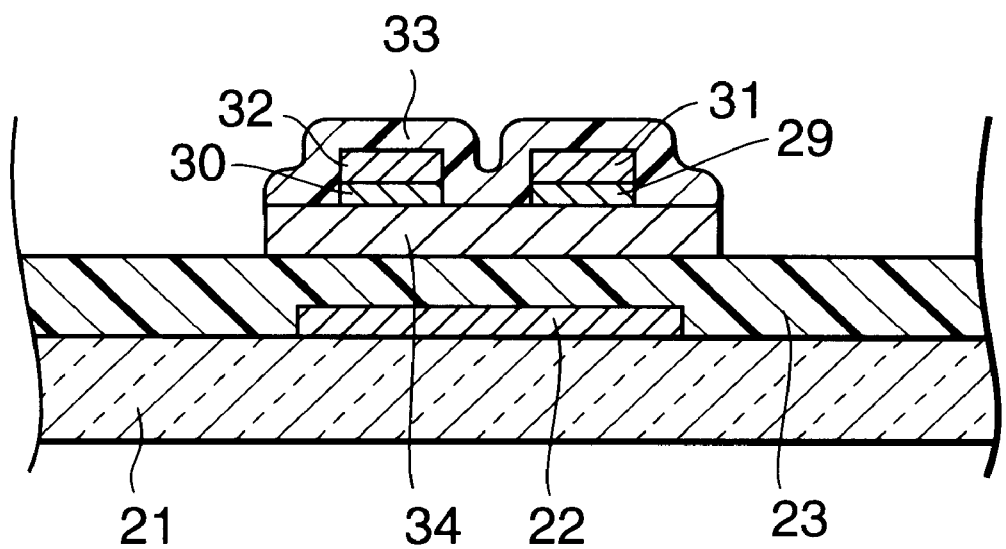
FIGS. 3A and 3B are schematic sectional views showing manufacturing processes following FIG. 2C.
Figure 3B:
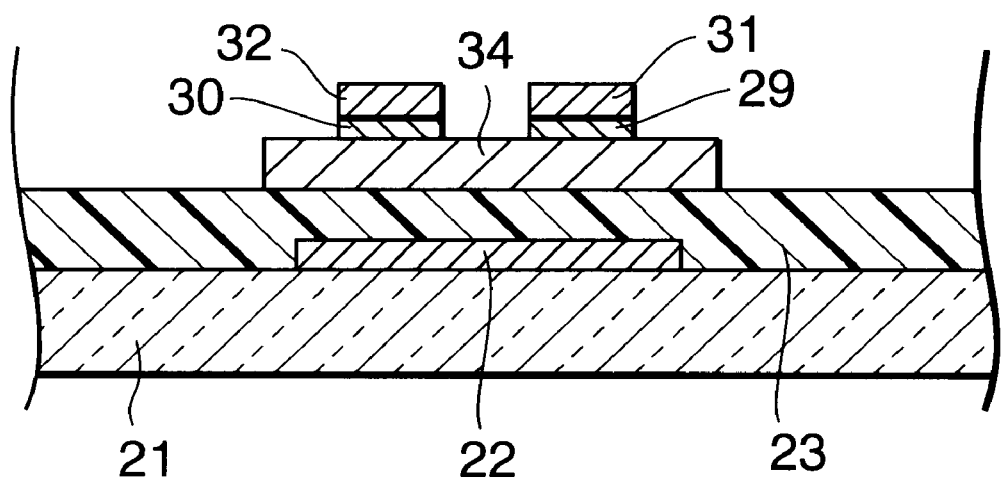

Next, second etching is applied to the a-Si film 24 using the reflowed resist mask 33 as an etching mask. As a result, as shown in FIG. 3A, an island layer 34 is formed. The reflowed resist mask 33 is removed and as shown in FIG. 3B, reverse staggered-type TFT is formed in a predetermined region on the base material 21. The description of the succeeding processes is omitted, however, for example, a pixel electrode, a passivation insulating film, an alignment layer and others are formed, a TFT device is completed, next, second base material opposite to the base material 21 is prepared, a color filter, a black matrix, a transparent electrode, a passivation film, an alignment layer and others are formed on the second base material, opposite base materials are completed, in case a vertical field-effect liquid crystal display is to be manufactured, the TFT device and the opposite base material are further bonded and when a liquid crystal composition is filled between the TFT device and the opposite base material (the opposite base materials are kept at a predetermined interval by a spacer), a liquid crystal display is completed.

In any embodiment described below, in case a vertical field-effect liquid crystal display is to be manufactured, the above-mentioned manufacturing processes continue after the manufacturing processes shown in the drawings.

In the third conventional example of the prior art, two photolithographic processes are required, however, in the second embodiment of the invention, the two processes are reduced to one. As a result, the manufacturing processes of staggered-type TFT are greatly reduced and the manufacturing cost is reduced. Hereby, the problem of the third conventional example is completely solved. In the second embodiment, in reflowing for the swelling of the dimension by the fusion of the resist mask, the resist masks 27 and 28 are exposed to the vapor of an organic solvent of acetone for 1 to 3 minutes, the acetone gradually infiltrates into the resist masks 27 and 28 and the resist masks are fused, however, the invention is not limited to this method. For another method, a method of dipping in the solution of an organic solvent the concentration of which is extremely dilute (for example, 1/100 to 1/1000) and which is already described in the first embodiment of the invention is available. However, in dipping in the solution of an organic solvent extremely dilute in the concentration, as resist is dissolved in the solution of the organic solvent and is peeled when the concentration of the organic solvent is high, the concentration of the organic solvent in the solution is required to be regulated so that a part of the organic solvent infiltrates into the resist without dissolution and peeling. For used organic solvents, the organic solvents already described in the first embodiment of the invention, that is, alcohols (R—OH), Alkoxy alcohols, ethers (R—O—R, Ar—O—R, Ar—O—Ar), esters, ketones, Glycols, Alkylene glycols, glycol ethers, concrete examples and mixed solvents of these organic solvents) are available.

For the material of the resist mask suitable for acetone of an organic solvent described in the first and second embodiments, the following organic resists are desirable. For example, for organic resist formed by a high molecular compound, sensitive material and other additives, there are resist made of only organic material and resist in which organic material and inorganic material are mixed.

For resist made of only organic material, there is polyvinyl ester cinnamate. For an example of rubber, there is resist acquired by mixing a bisazide compound with cyclized polyisoprene and cyclized polybutadiene. For an example of novolak resin, there is resist acquired by mixing cresol novolak resin and ester naphthoquinonediazide-5-sulfonate. Further, for an example of copolymer resin of acrylic acid, there are polyacrylamide and polyamide acid. For other examples, there is resist to which bromine and iodine are added or resist including them much.

In the meantime, for resist made of organic material and inorganic material, there are resists including siloxane as an example of resist including Si or polysiloxane, polysilane, polysilen or carbosilane and there is resist including germanium as an example of resist including metal except Si.

The resist mask described in the first and second embodiments may be also formed by negative or positive resist. For a positive type, a resist mask acquired by mixing cresol novolak resin and ester naphthoquinonediazide-5-sulfonate for example is suitable. For a negative type, a resist mask acquired by mixing a bisazide compound with cyclized polyisoprene and cyclized polybutadiene which are respectively rubber for example is suitable.

In addition to the methods described in the invention, the fine control of a desired etching pattern is also enabled by etching after readjusting the size of the expansion of the resist mask by the $O_2$ ashing processing of the resist mask and UV ozone processing for example for reducing the area of the resist mask by removing apart excessively expanded of the resist mask after reflowing the resist mask.

Further, in addition to the methods described in the invention, if a method of reflowing the resist mask further again and etching again is used after etching processing after reflowing the resist mask within a range in which a function as a resist mask is not damaged, the patterning of a pattern having a complex shape is also enabled.

Further as described in the invention, pattern formation by combining expanding the dimension by reflowing the resist mask, reducing the dimension by the $O_2$ ashing processing of the resist mask and others and etching processing a few times or more is also enabled and hereby, the patterning of a pattern having a complex shape is also enabled.

Next, a third embodiment and succeeding embodiments based upon the basic concept of the invention will be further concretely described. FIGS. 4 to 7 show a manufacturing method equivalent to the third embodiment in the order of the manufacturing processes, in the respective drawings, A is a schematic plan showing the vicinity of TFT and B is a schematic sectional view viewed along a cutting-plane line A–A' in A. In A, a terminal through which a gate electrode is led outside is also shown together and this reason is that the structure of the terminal through which the gate electrode is led is different from the structure of a terminal through which a drain electrode is led. As the terminal through which the drain electrode is led is the same as the structure of a pixel electrode shown in FIG. 7B, the terminal is not shown. The structure of a terminal in fourth and fifth embodiments is the same as that in the third embodiment.

Figure 4A:
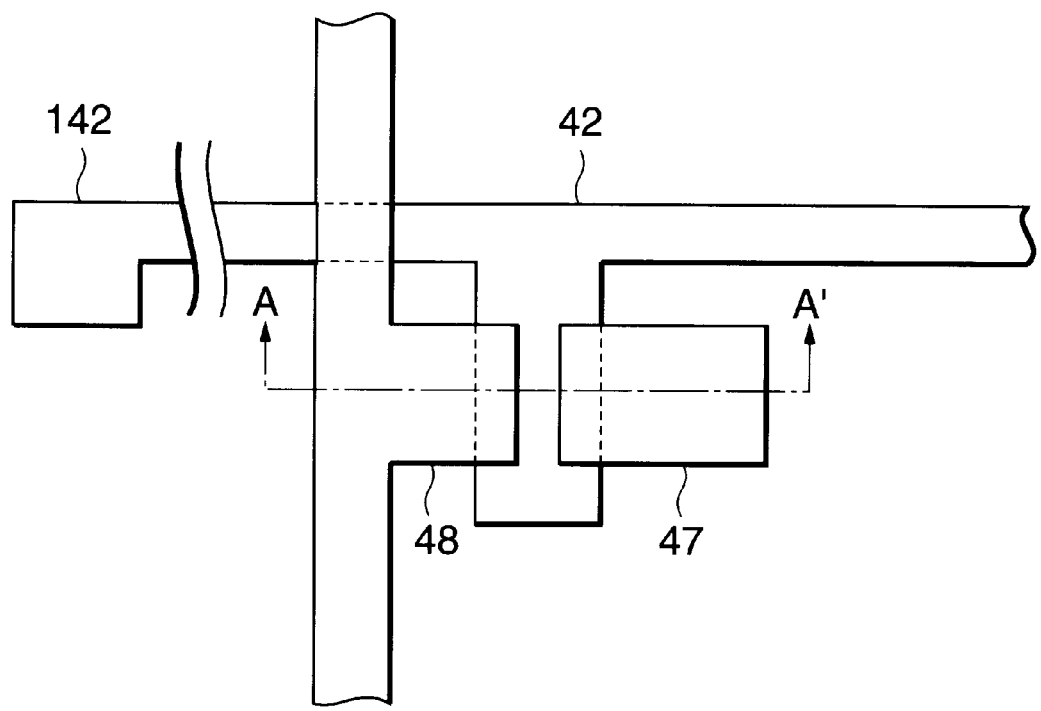
FIGS. 4A and 4B are a schematic plan and a schematic sectional view respectively showing the manufacturing process of a third embodiment of the invention.
Figure 4B:
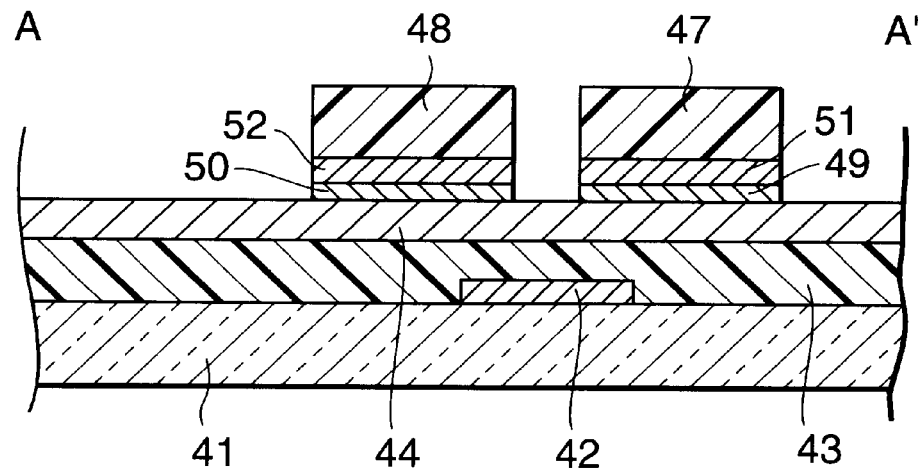
Figure 5A:
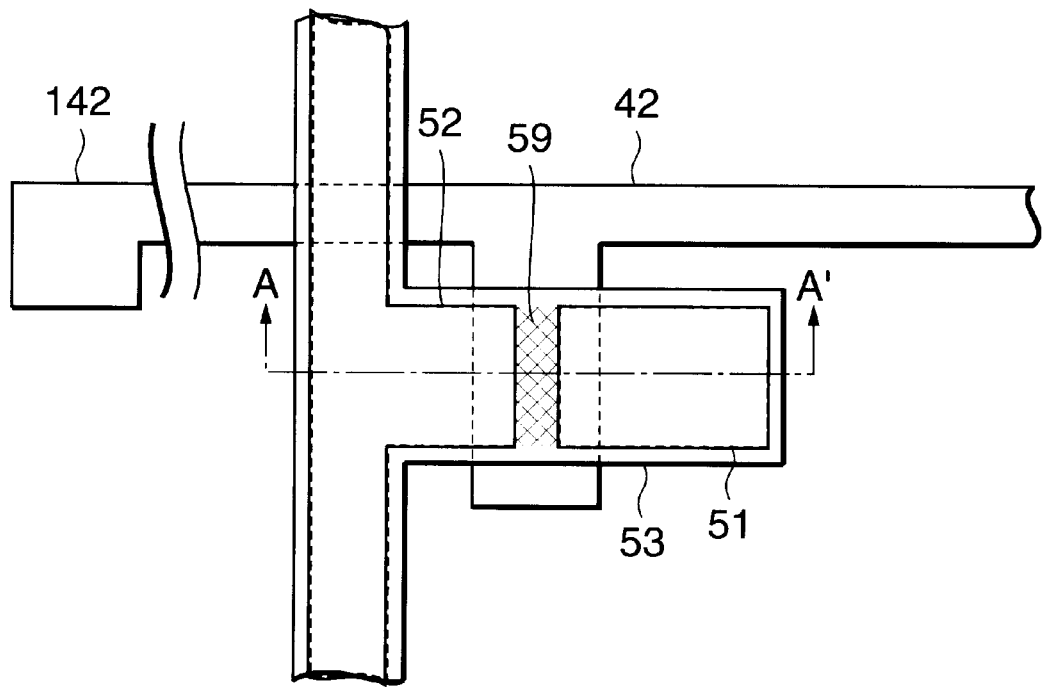
FIGS. 5A and 5B are a schematic plan and a schematic sectional view respectively showing a manufacturing process following FIGS. 4A and 4B.
Figure 5B:
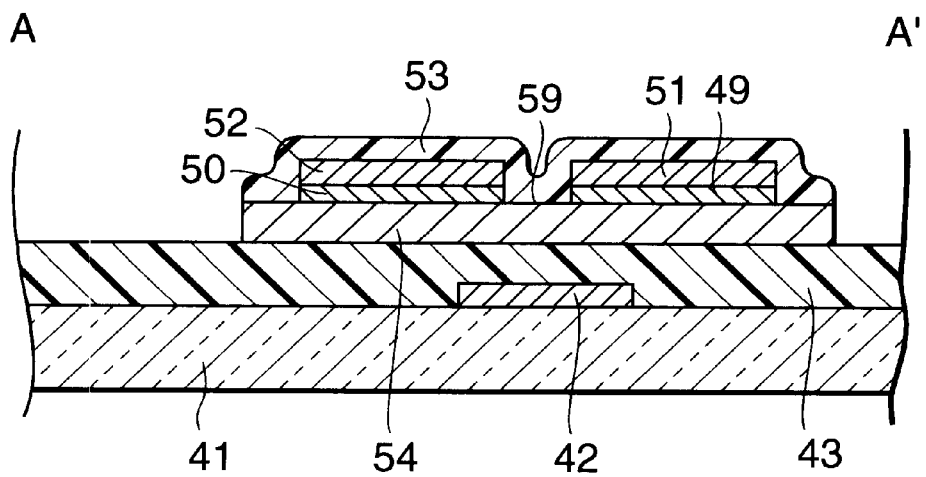

As FIGS. 4B and 5B showing the manufacturing method equivalent to the third embodiment are respectively the same as FIGS. 2A and 2B in the second embodiment of the invention, the detailed description is omitted.

As in the second embodiment, a gate electrode 42 which is led to a gate terminal electrode 142, a gate insulating film 43, an a-Si film 44 to be an island layer, ohmic contact layers 49 and 50 formed by an N+-type a-Si film, a source electrode 51 and a drain electrode 52 are formed on base material 41 using resist masks 47 and 48 as a mask as shown in FIG. 4A.

Next, as shown in FIG. 5B, a reflowed and united resist mask 53 is formed and when the a-Si film 44 is etched using the resist mask as a mask, an island layer 54 formed by the a-Si film 44 is formed. Further afterward, the reflowed resist mask 53 is peeled and removed. For peeling liquid, peeling liquid acquired by mixing dimethyl sulfoxide (DMSO) and monoethanolamine is used in wet peeling processing. Furthermore afterward, the resist mask is processed in $O_2$ plasma or UV ozone.

Figure 6A:
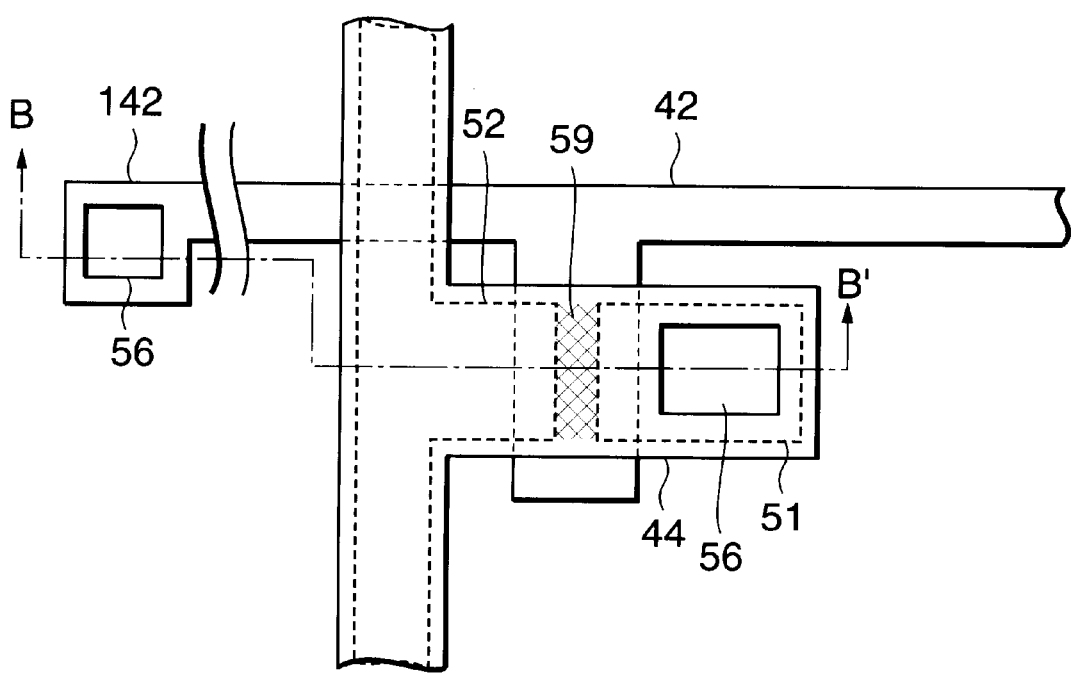
FIGS. 6A and 6B are a schematic plan and a schematic sectional view respectively showing a manufacturing process following FIGS. 5A and 5B.
Figure 6B:
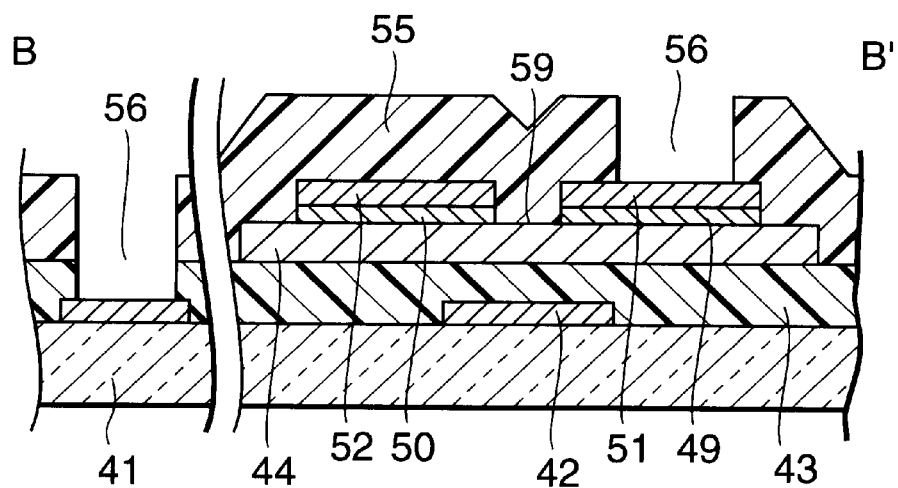

Next, as shown in FIG. 6B, after a passivation film 55 is formed, a contact hole 56 is formed on the source electrode 51 by a photolithographic process and dry etching processing under conditions of $SF_6$/He gas =50/150 sccm, 10 Pa and 1000 W for 250 seconds. As the gate insulating film 43 and the passivation film 55 cover the gate terminal electrode 142 at this time, the contact hole 56 of the gate terminal electrode 142 is formed so that the contact hole penetrates the films.

Figure 7A:
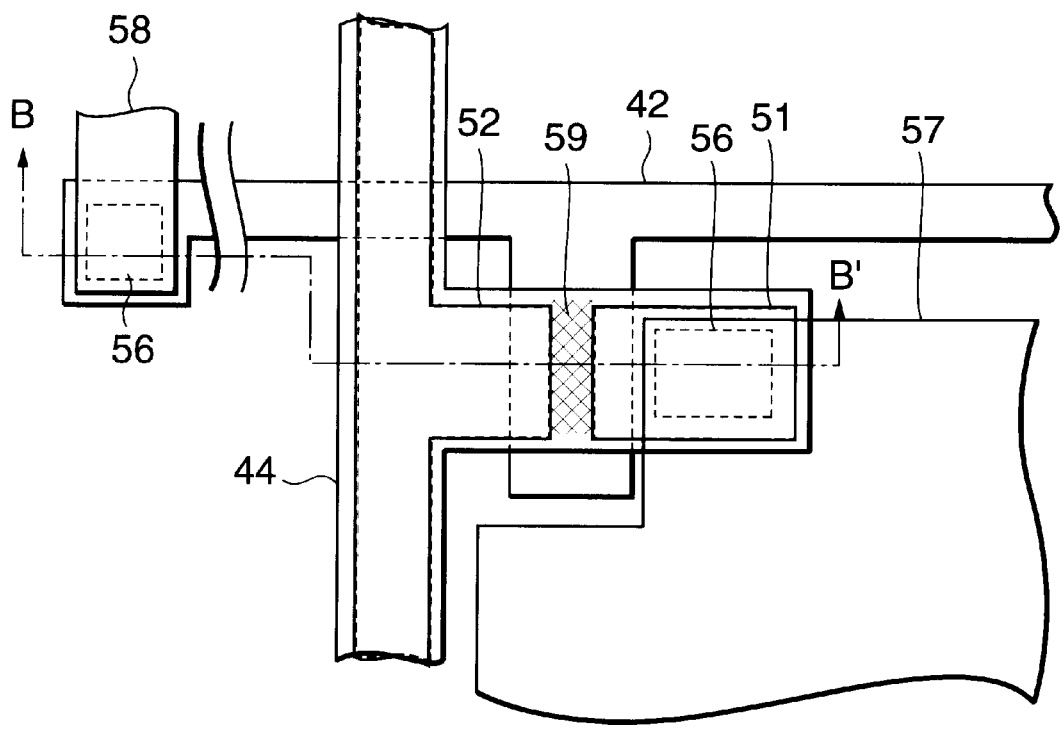
FIGS. 7A and 7B are a schematic plan and a schematic sectional view respectively showing a manufacturing process following FIGS. 6A and 6B.
Figure 7B:
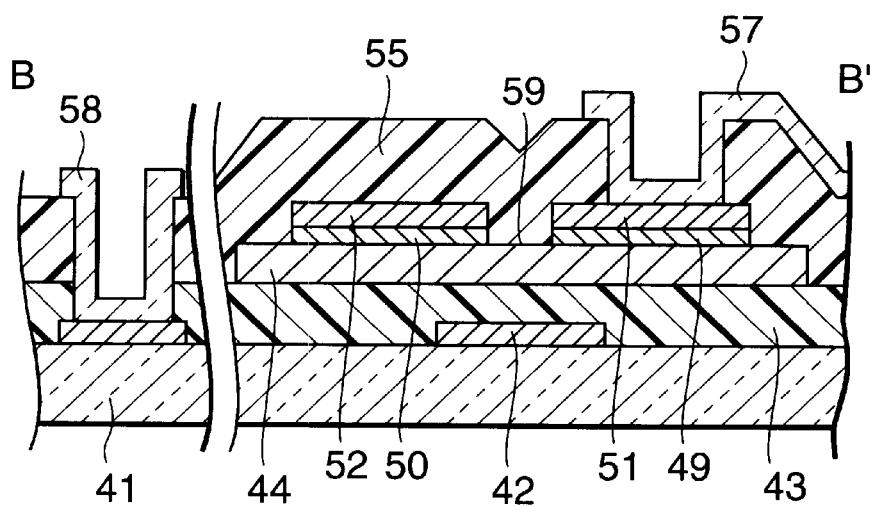

Finally, as shown in FIG. 7B, after a transparent metallic film made of ITO is formed, a pixel electrode 57 and a terminal electrode 58 are formed by a photolithographic process and etchant of ferric chloride. Hereby, a thin film transistor array for a liquid crystal display and a pixel electrode are formed.

In this embodiment, as shown in the schematic plan of FIG. 5A, the reflowed resist mask 53 completely covers the source electrode 51 and the drain electrode 52 including a predetermined margin, reflows sideways so that a channel region 59 of TFT between the source electrode 51 and the drain electrode 52 is completely covered and the island layer 54 is patterned according to the pattern of the reflowed resist mask 53.

Next, referring to FIGS. 8 to 11, a manufacturing method equivalent to the fourth embodiment of the invention will be described. In the respective drawings, A is a schematic plan showing the vicinity of TFT and B is a schematic sectional view viewed along a cutting-plane line A–A' in A. This embodiment is similar to the third embodiment in the basic structure and the process.

Figure 8A:
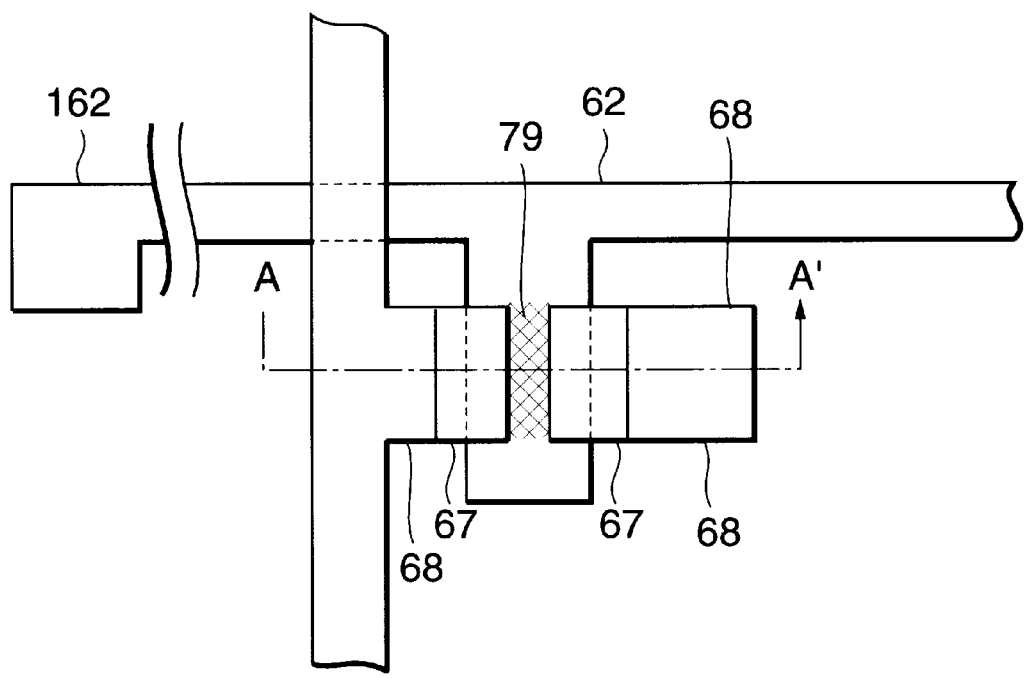
FIGS. 8A and 8B are a schematic plan and a schematic sectional view respectively showing the manufacturing process of a fourth embodiment of the invention.
Figure 8B:
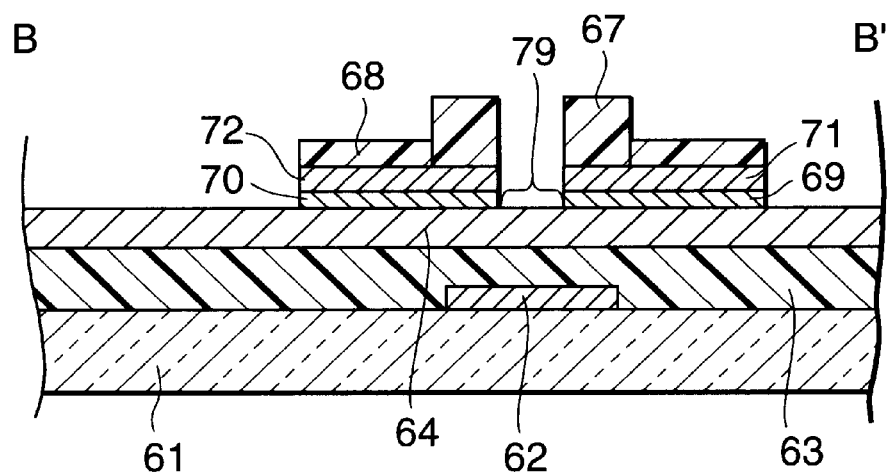

This embodiment is different from the third embodiment in that as shown in FIG. 8B, a thicker resist mask 67 having normal thickness (approximately 3 $\mu$m) and a thinner resist mask 68 (thickness: approximately 0.2 to 0.7 $\mu$m) are formed for a resist mask.

As shown in FIG. 8A, only the resist masks respectively located on the side of a channel region 79 respectively on a source electrode 71 and a drain electrode 72 are thickened to be the thicker resist mask 67 and the resist masks apart from the channel region 79 are thinned to be the thinner resist mask 68.

For a method of controlling the partial thickness of the resist mask, (1) a method of forming a shielding part and a semi-shielding part for controlling the quantity of transmitted light at least at two stages or more are formed in a mask pattern equivalent to a reticle used in an exposure process, transferring the shielding part and the semi-shielding part on a resist film and forming a resist mask and (2) a method of forming a resist mask by varying the quantity of exposure at least at two stages or more using two or more types of reticle masks in the exposure process and exposing to light can be given.

First etching is applied using the resist mask formed as described above, and ohmic contact layers 69 and 70, the source electrode 71 and the drain electrode 72 are formed.

Figure 9A:
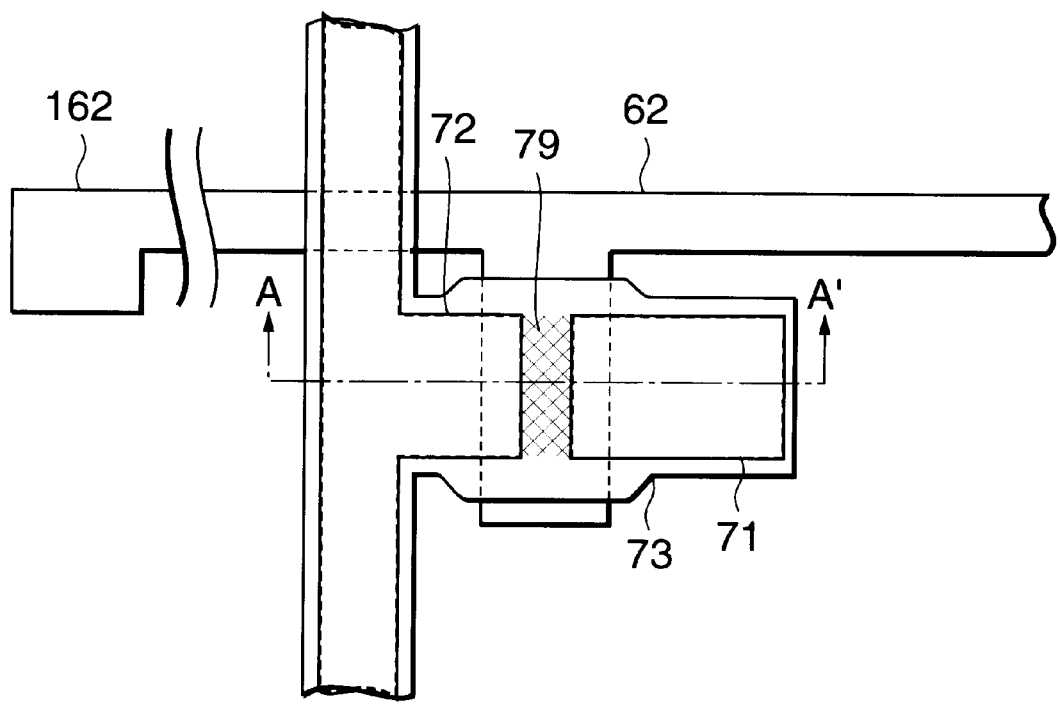
FIGS. 9A and 9B are a schematic plan and a schematic sectional view respectively showing a manufacturing process following FIGS. 8A and 8B.
Figure 9B:
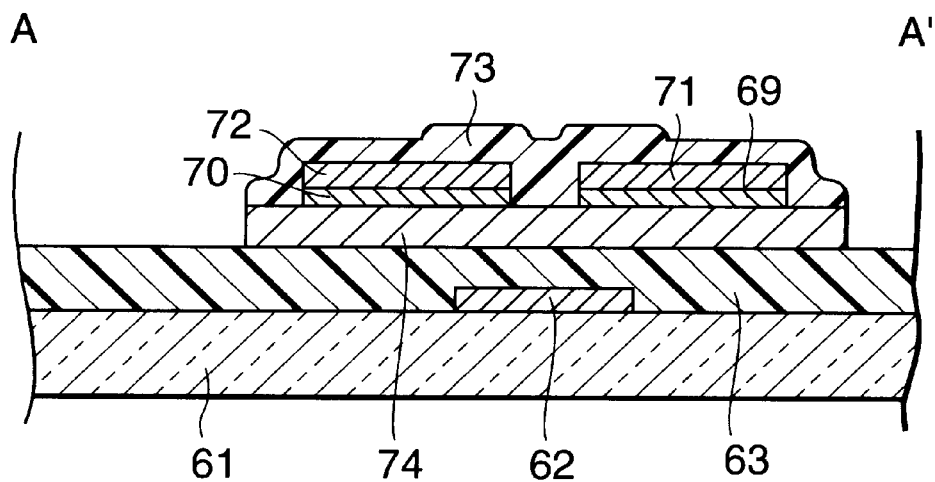

Next, as shown in FIG. 9B, when the thicker resist mask 67 and the thinner resist mask 68 are exposed to the vapor of an organic solvent for 1 to 3 minutes together with the base material 61, acetone gradually infiltrates into the thicker resist mask 67 and the thinner resist mask 68 and the resist masks are reflowed. As shown in FIG. 9A, each area of the thicker resist mask 67 and the thinner resist mask 68 is expanded by reflowing the resist masks to be a reflowed resist mask 73. However, in this case, out of the reflowed resist mask 73, the area of the thicker resist mask 67 is largely expanded sideways with the channel region 79 in the center and the expansion of the area of the thinner resist mask 68 out of the reflowed resist mask 73 is smaller, compared with that of the thicker resist mask 67.

Next, when second etching is applied to an a-Si film 64 using the reflowed resist mask 73 as a mask, an island layer 74 widely patterned with the channel region 79 in the center is formed as shown in FIG. 9B.

Figure 10A:
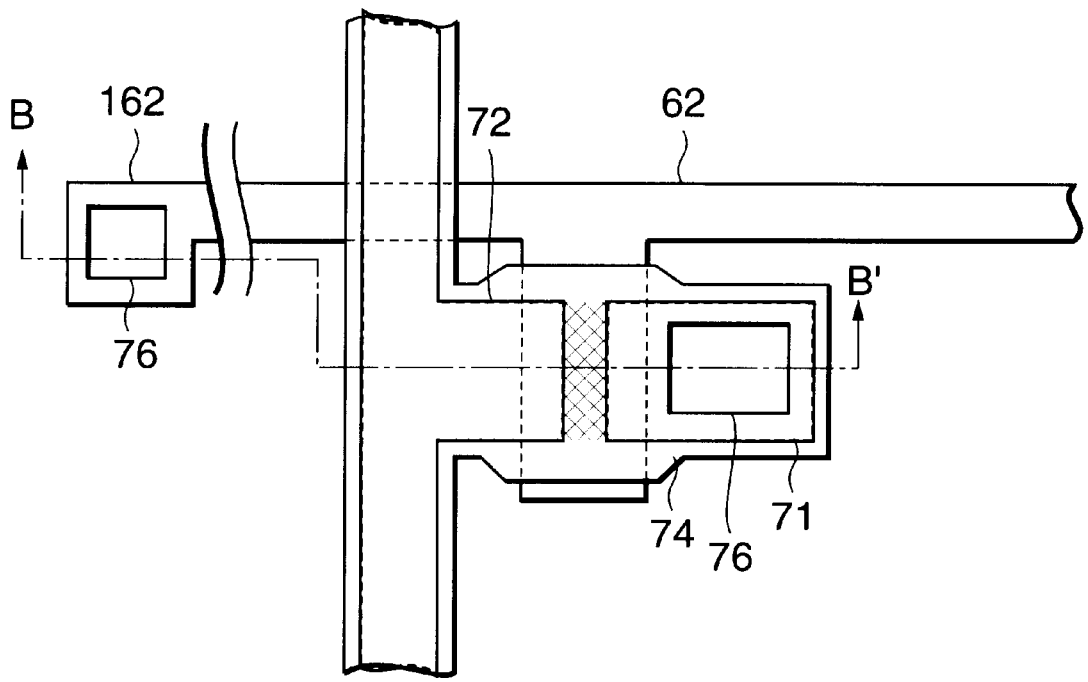
FIGS. 10A and 10B are a schematic plan and a schematic sectional view respectively showing a manufacturing process following FIGS. 9A and 9B.

In this case, the dimension of the island layer 74 is controlled by using the reflowed resist mask 73 as shown in FIG. 10A so that the dimension is large in the vicinity of the channel region 79 and is small around the source electrode 71 and the drain electrode 72 respectively apart from the channel region 79 and this point is different from the third embodiment. This is to form the island layer in the vicinity of the channel region of TFT so that the island layer is wide utilizing the resist masks 67 and 68 for respectively forming the source electrode and the drain electrode, to form a semiconductor active layer in TFT with a room and to form the island layer in a region apart from the semiconductor active layer in the width close to the width of the source electrode 71 and the drain electrode 72 so that parasitic capacity with the gate electrode (gate wiring) provided under the island layer is reduced. Hereby, the fourth embodiment has a merit that an extra island layer can be prevented from being formed around source wiring and drain wiring, compared with the third embodiment.

Figure 10B:
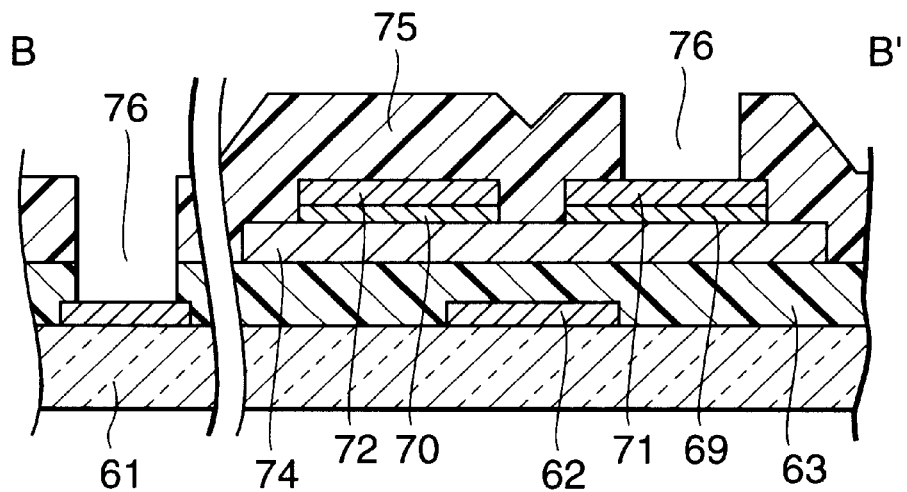
Figure 11A:
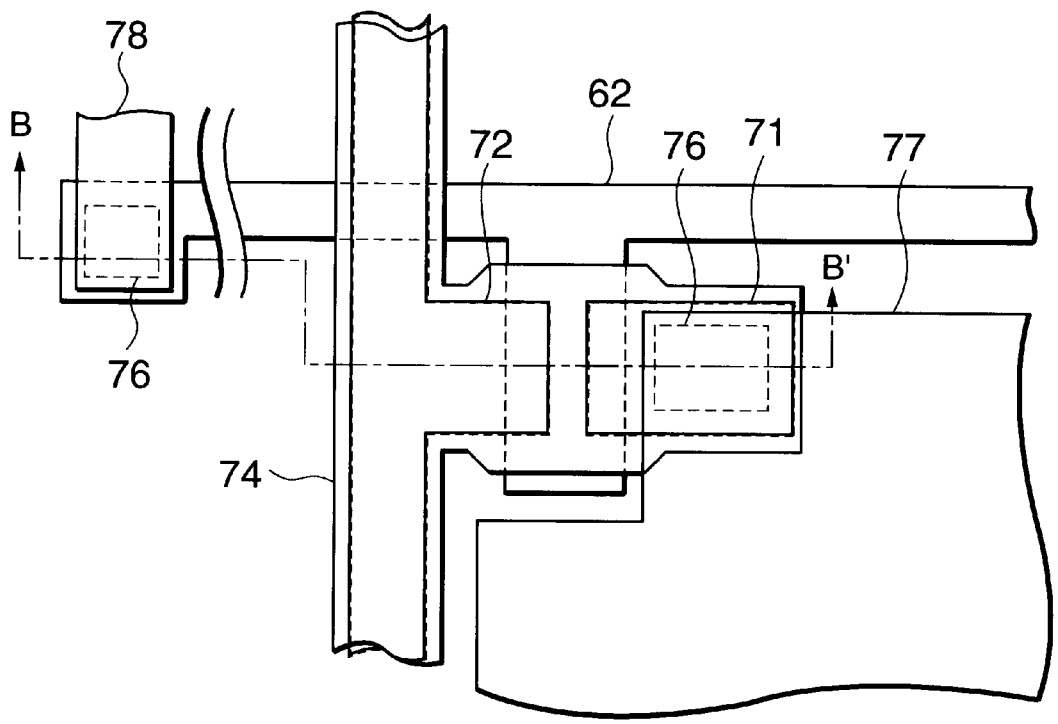
FIGS. 11A and 11B are a schematic plan and a schematic sectional view respectively showing a manufacturing process following FIGS. 10A and 10B.
Figure 11B:
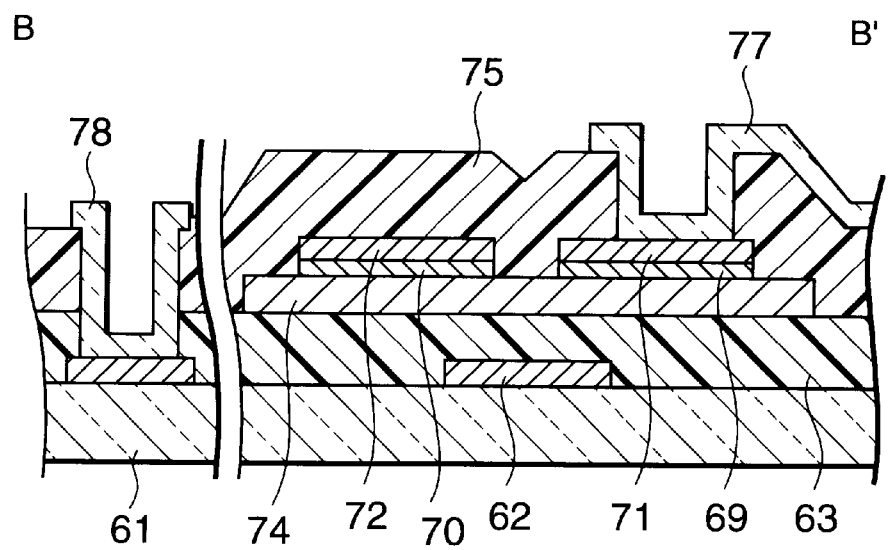

For the succeeding process, the reflowed resist mask 73 is peeled and removed, as in the third embodiment, a passivation film 75, a contact hole 76, a pixel electrode 77 and a terminal electrode 78 are formed as shown in FIGS. 10B and 11B and a thin film transistor array for a liquid crystal display and pixel electrodes are acquired.

Next, referring to FIGS. 12 to 15, a manufacturing method equivalent to a fifth embodiment of the invention will be described. In the respective drawings, A is a schematic plan showing the vicinity of TFT and B is a schematic sectional view viewed along a cutting-plane line A–A' in A. This embodiment is similar to the fourth embodiment in the basic structure and the process.

Figure 12A:
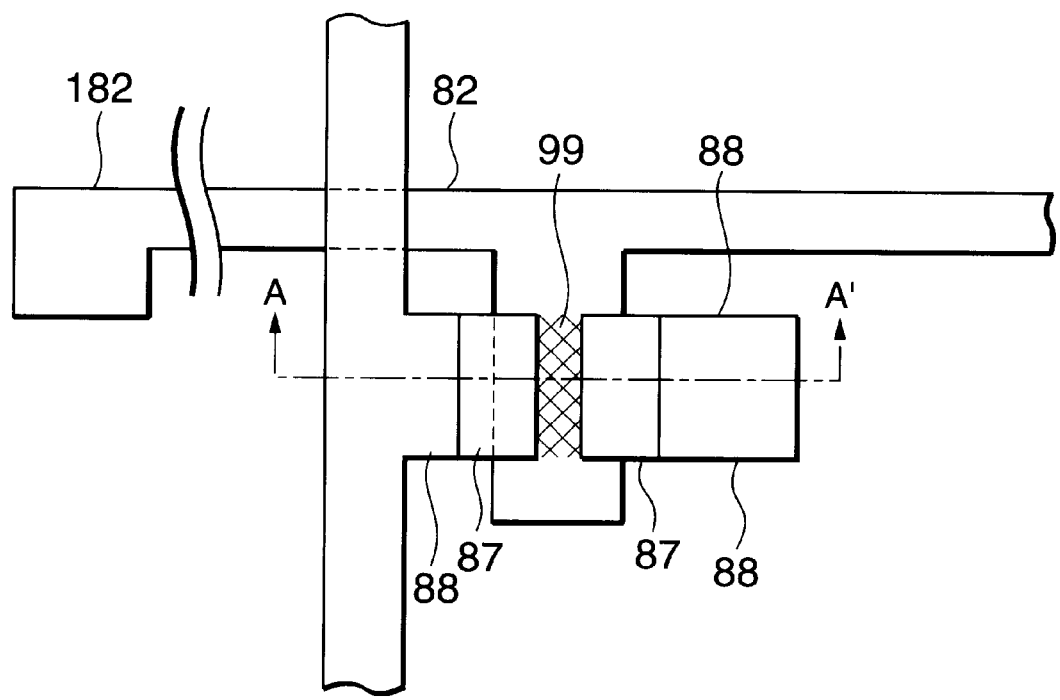
FIGS. 12A and 12B are a schematic plan and a schematic sectional view respectively showing the manufacturing process of a fifth embodiment of the invention.
Figure 12B:
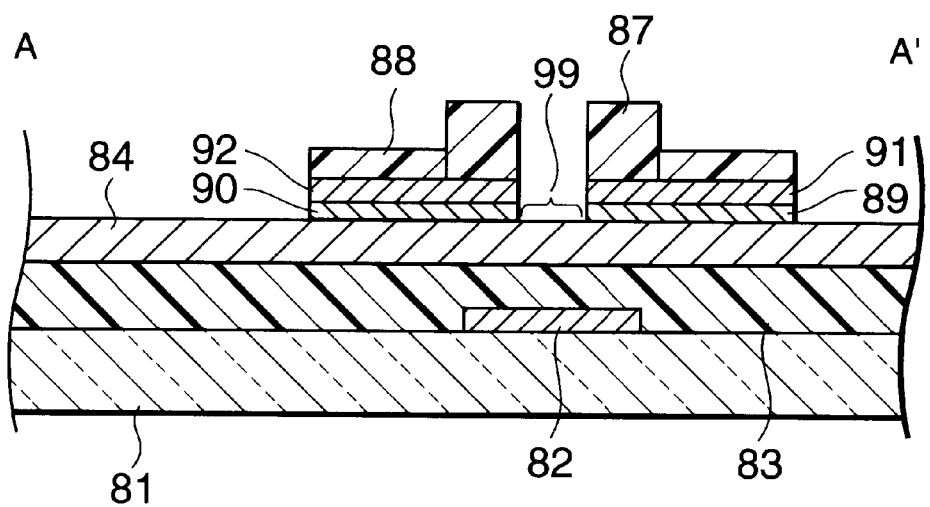

This embodiment is different from the fourth embodiment in that as shown in FIG. 12B, in case a resist mask is formed, the resist mask is formed so that it is composed of a thicker resist mask 87 having normal thickness (approximately 3 $\mu$m) and a thinner resist mask 88 (thickness: approximately 0.2 to 0.7 $\mu$m).

Only the resist mask in a part located on the side of a channel region 99 on a source electrode 91 and a drain electrode 92 is made thick to be the thicker resist mask 87 and the resist mask in a part separate from the channel region 99 is made thin to be the thinner resist mask 88. First etching is applied using the resist mask formed as described above, and ohmic contact layers 89 and 90, the source electrode 91 and the drain electrode are formed.

This embodiment is different from the fourth embodiment in that after first etching, ashing processing is executed in the atmosphere of $O_2$ plasma and the thinner resist mask 88 (thickness: approximately 0.2 to 0.7 $\mu$m) out of the resist mask is completely removed. Hereby, as shown in FIG. 13B, only the thicker resist mask 87 out of the resist mask is left to be a residual resist mask 100.

Next, when the residual resist mask 100 in which only a part of the thicker resist mask 87 is left is exposed to the vapor of an organic solvent for 1 to 3 minutes together with a base material 81, the organic solvent gradually infiltrates into the residual resist mask 100 and the residual resist mask 100 is reflowed. As shown in FIG. 14B, the area of the residual resist mask 100 is expanded by reflowing the residual resist mask 100 to be a reflowed resist mask 93.

Figure 13A:
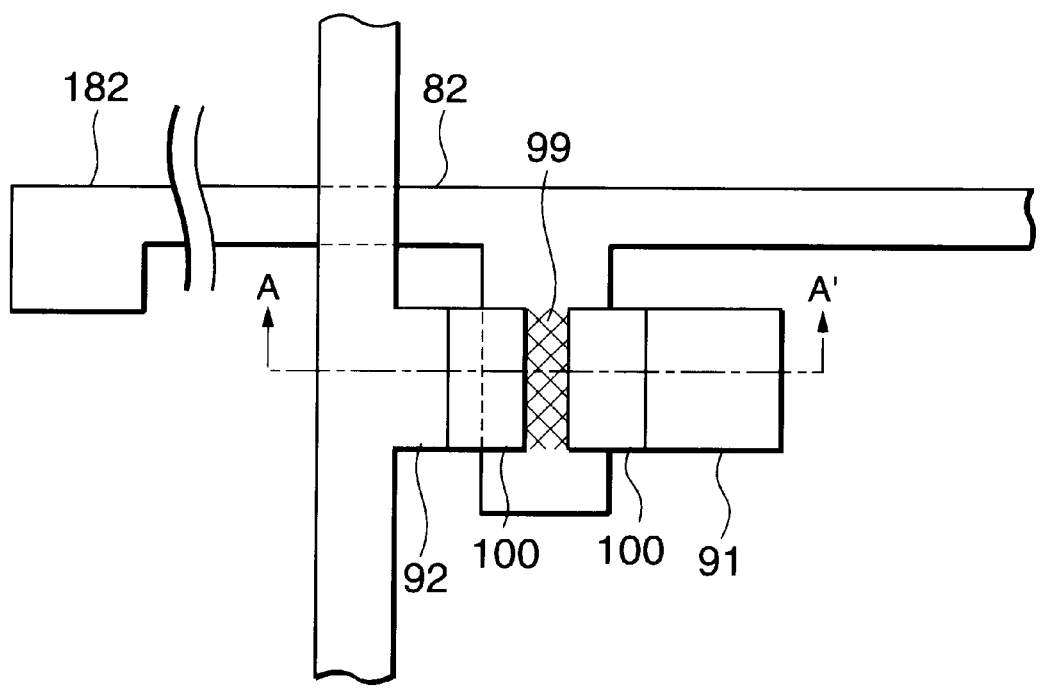
FIGS. 13A and 13B are a schematic plan and a schematic sectional view respectively showing a manufacturing process following FIGS. 12A and 12B.
Figure 13B:
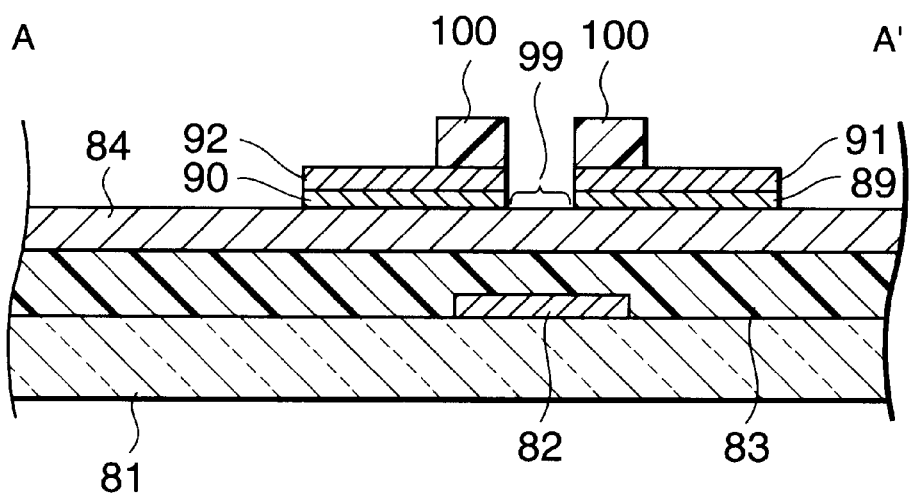
Figure 14A:
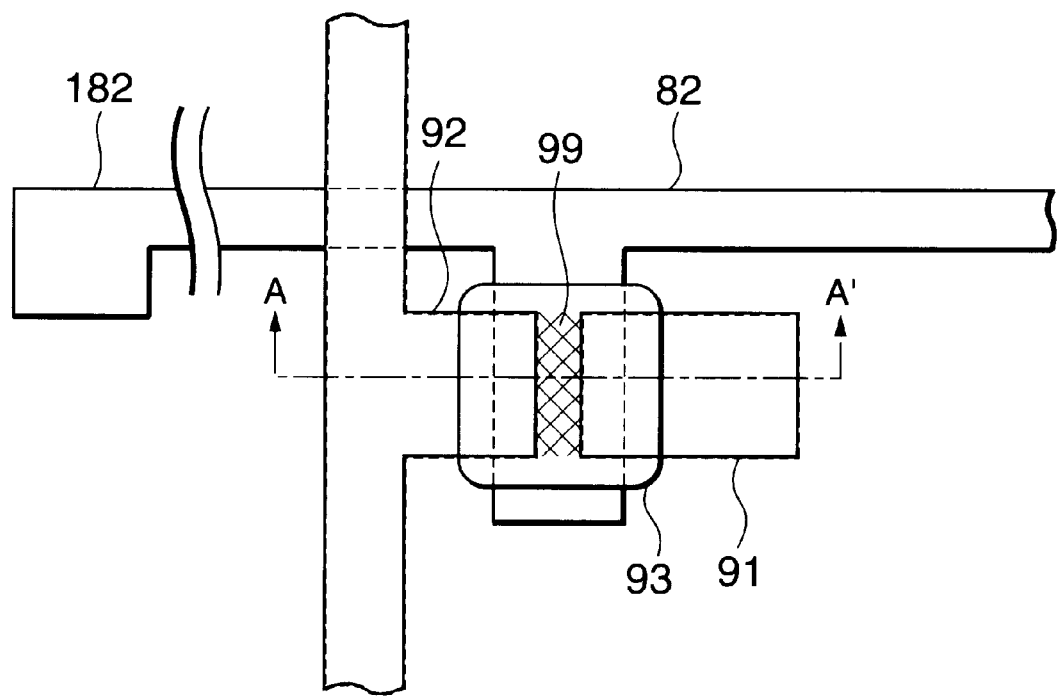
FIGS. 14A and 14B are a schematic plan and a schematic sectional view respectively showing a manufacturing process following FIGS. 13A and 13B.
Figure 14B:
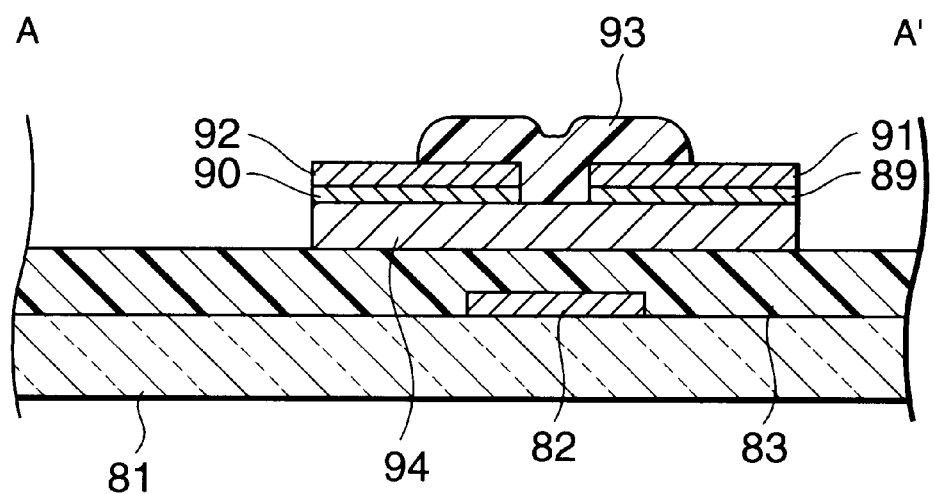

However, in this case, as shown in FIG. 13A, the residual resist mask 100 is formed only on the side of the channel region 99 on the source electrode 91 and the drain electrode 92, these two residual resist masks 100 are united by reflowing to be the reflowed resist mask 93 as shown in FIG. 14A and only the vicinity of the channel region 99 out of the a-Si film 84 is covered. The source electrode 91 and the drain electrode 92 respectively located apart from the channel region 99 are not covered with the reflowed resist mask 93.

Next, as shown in FIG. 14B, second etching is applied to the a-Si film 84 using the reflowed resist mask 93 as a mask and an island layer 94 is formed. In this case, as shown in FIG. 14A, the island layer 94 is largely expanded in the vicinity of the channel region 99 by using the reflowed resist mask 93, a region apart from the channel region 99 has no reflowed resist mask 93, the source electrode 91 and the drain electrode 92 function as an etching mask instead of resist, and as the a-Si film 84 is etched with it self-aligned with the pattern of the source electrode 91 and the drain electrode 92 (also including wiring connected to the source electrode 91 and the drain electrode 92 in addition to these two), the island layer 94 can be formed without extra expansion in the region apart from the channel region 99, compared with the fourth embodiment. This embodiment is different from the fourth embodiment in this point. It is the object of this embodiment to form the island layer utilizing the resist masks for forming the source electrode and the drain electrode 88 and 87 so that the island layer has different shapes in the vicinity of the channel region of TFT and the region except the vicinity of the channel region, and hereby, as described in relation to the fourth embodiment, this embodiment has a merit that parasitic capacity particularly between the island layer 94 and gate wiring under it can be further reduced, compared with that in the fourth embodiment.

Figure 15A:
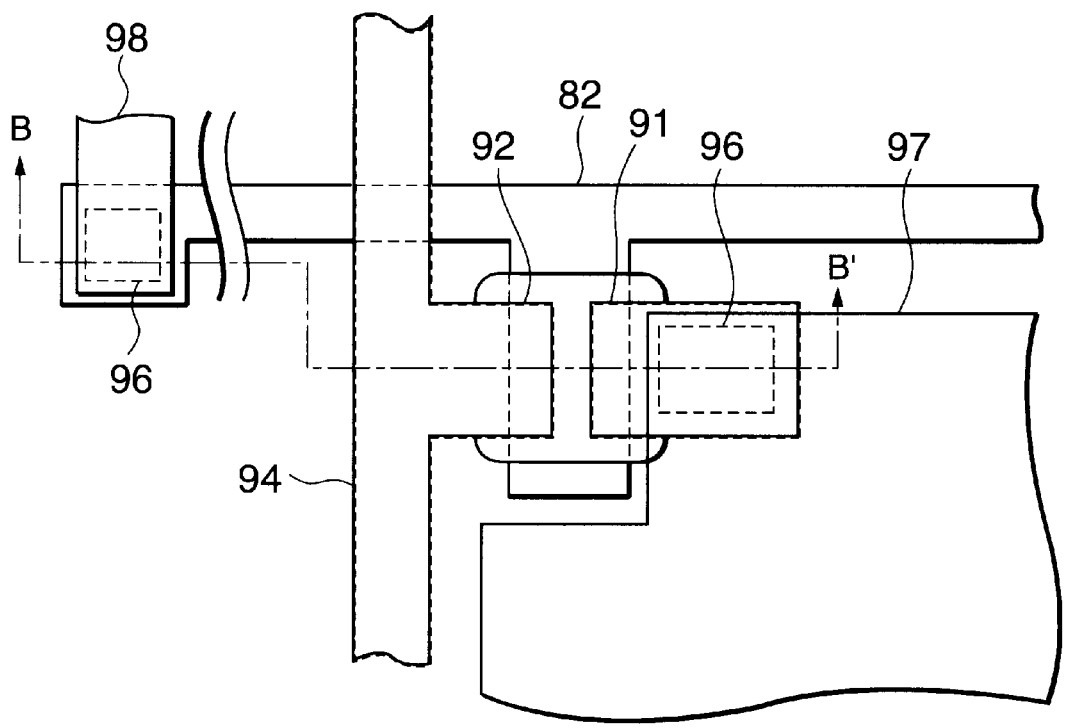
FIGS. 15A and 15B are a schematic plan and a schematic sectional view respectively showing a manufacturing process following FIGS. 14A and 14B.
Figure 15B:
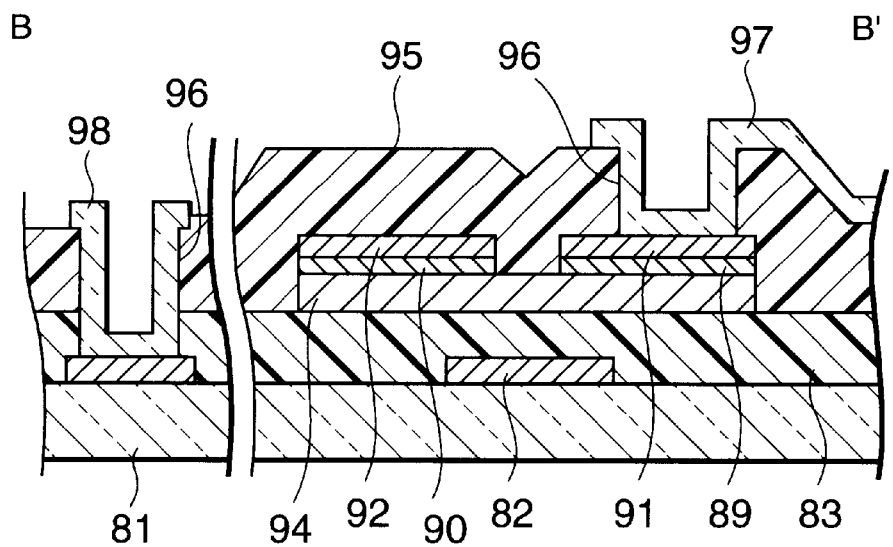

For a process succeeding after the is 1 and layer 94 is formed, the reflowed resist mask 93 is peeled and removed and as shown in FIGS. 15A and 15B, a passivation film 95, a contact hole 96, a pixel electrode 97 and a terminal electrode 98 are formed as in the third embodiment, and a thin film transistor array for a liquid crystal display and pixel electrodes are acquired.

Figure 16A:
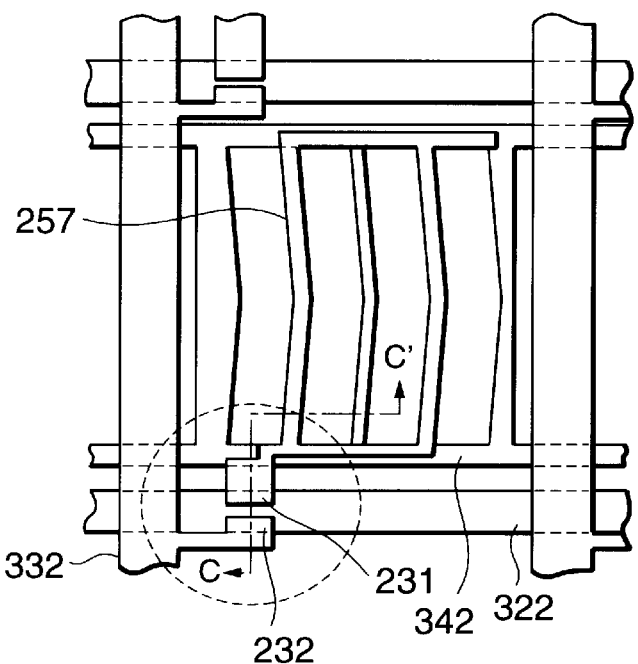
FIGS. 16A and 16B are a schematic plan and a schematic sectional view respectively showing a liquid crystal display equivalent to a sixth embodiment of the invention.
Figure 16B:
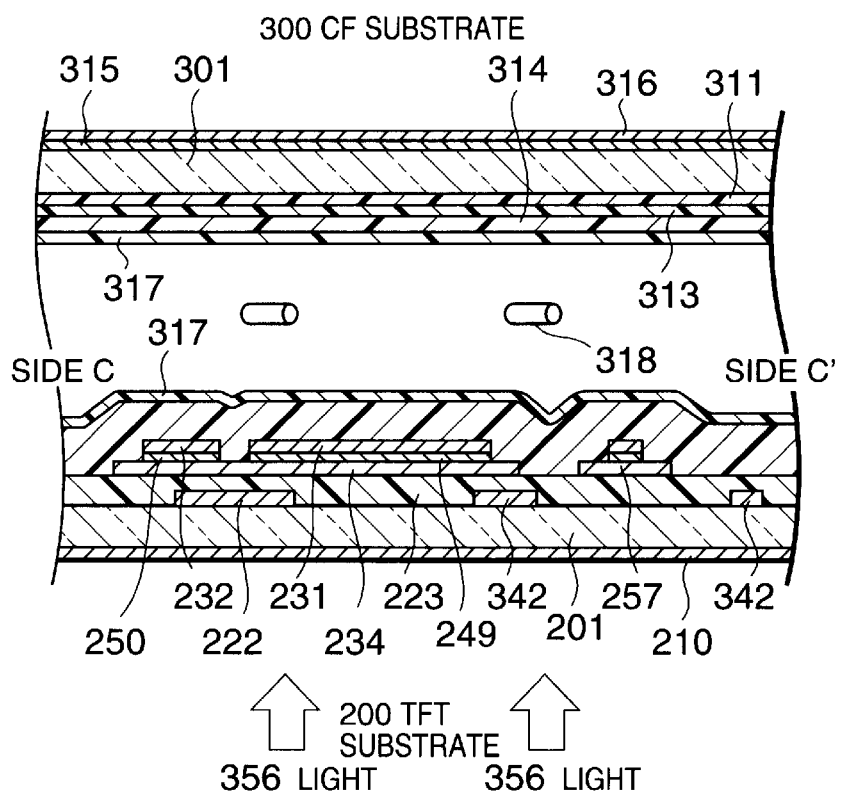

Next, referring to FIGS. 16 to 22, an example in which the invention is applied to a horizontal-type field-effect liquid crystal display will be described as a sixth embodiment. FIGS. 16A and 16B show a display cell for one pixel of TFT, FIG. 16A is a plan view when TFT is viewed from the top, and FIG. 16B is a sectional view when TFT, a liquid crystal and a CF substrate (color filter substrate opposite to TFT) are cut with a plane along a cutting-plane line C–C' shown in FIG. 16A and perpendicular to TFT. FIGS. 17 to 22 are sectional views showing the manufacturing method of TFT of the horizontal-type field-effect liquid crystal display in the order of manufacturing processes, in each drawing, A is a sectional view viewed along the cutting-plane line C–C' shown in FIG. 16A, and B and C are sectional views respectively showing a gate terminal as a terminal for leading gate wiring outside and a drain terminal as a terminal for leading drain wiring outside though the terminals are not shown in FIG. 16A.

Referring to FIGS. 16A and 16B, the operation of the horizontal-type field-effect liquid crystal display will be briefly described below.

Gate wiring 322 which also functions as a gate electrode 222 is first arranged on a first insulating transparent substrate 201 such as a glass substrate in parallel on the substrate and simultaneously, a common electrode 342 is also formed. The common electrode 342 has a comb-type shape and generates an electric field with it corresponding to a comb-type pixel electrode formed in a subsequent process. A gate insulating film 223 is formed on the gate wiring 322 and the common electrode 342 and drain wiring 332 is formed so that the drain wiring crosses the gate wiring 322. The drain wiring 332 also functions as a drain electrode 232 and at the same time as the drain wiring 332 is formed, a source electrode 231 and a comb-type pixel electrode 257 connected to the source electrode are formed. A passivation film 255 is formed with the film covering the drain wiring 332, the source electrode 231 and the pixel electrode 257, for the gate wiring 322 and the drain wiring 332, the insulating film on them is cut for connection to an external device at the end of the substrate, a contact hole is formed though it is not shown in FIGS. 16, and electric information is applied to the gate wiring 322 and the drain wiring 332 via the contact hole from an external device.

The pixel electrode 257 forms an electrode parallel with the common electrode 342 formed under it as shown in FIG. 16A, an electric field substantially parallel to the surface of the first transparent substrate 201 is generated by applying voltage between these electrodes and controls the orientation of a liquid crystal 318 filled between the first transparent substrate 201 and a substrate opposite to the first transparent substrate.

Next, referring to FIGS. 17 to 23, the manufacturing method of a horizontal-type field-effect liquid crystal display equivalent to a sixth embodiment will be described.

Figure 17A:
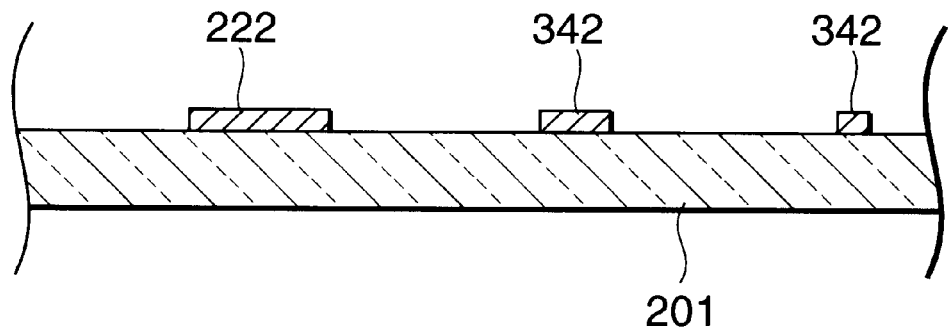
FIGS. 17A to 17C are schematic sectional views showing the manufacturing processes of the sixth embodiment of the invention.
Figure 17B:
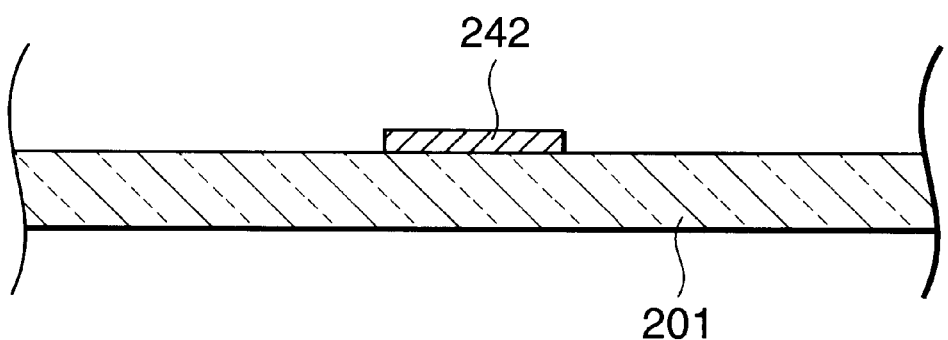
Figure 17C:
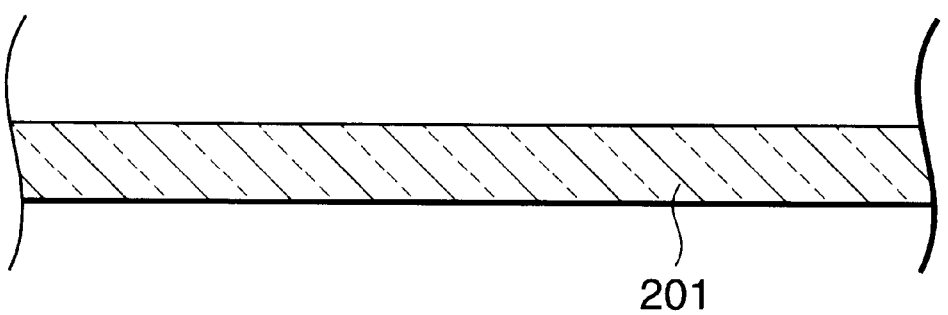

First, the gate electrode 222 made of Cr and others is formed on the first transparent substrate 201 and a t this time simultaneously, the common electrode 342 and a gate terminal electrode 242 are formed in another region on the first transparent substrate 201 (first process shown in FIGS. 17A to 17C).

Next, a silicon oxide film and a silicon nitride film (SiNx) are sequentially deposited on the whole surface of the first transparent substrate 201 to be a gate insulating film 223, next, an a-Si film 224, an N$^+$-type a-Si film 225 and a metallic film for a source and a drain 226 are sequentially deposited and further, resist masks 227, 228 and 229 are formed on the metallic film 226. The metallic film 226 and the N$^+$-type a-Si film 225 are patterned so that they have the same pattern using the resist masks 227, 228 and 229 as a mask (second process shown in FIGS. 18A to 18C). At this time, the resist mask 227 also functions as a mask for a comb-type pixel electrode in the center of a pixel as shown in FIG. 16A, and the pixel electrode 257 and an ohmic contact layer (not shown) under the pixel electrode are formed.

Figure 19A:
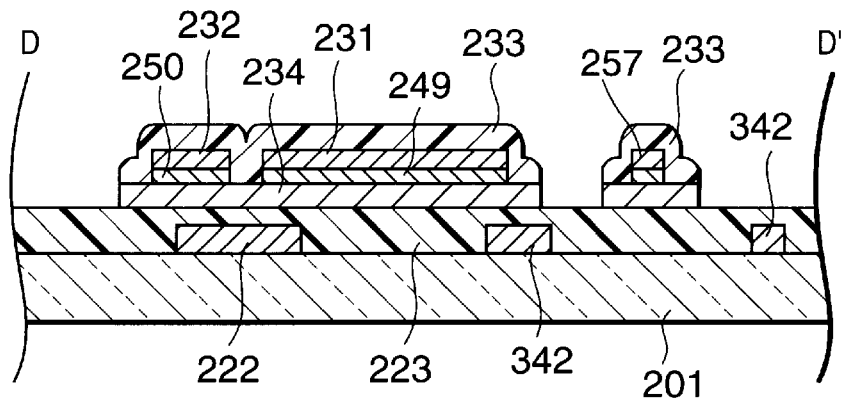
FIGS. 19A to 19C are schematic sectional views showing manufacturing processes following FIG. 18C.

Next, the resist masks 227, 228 and 229 are exposed to the vapor of an organic solvent of acetone for 1 to 3 minutes together wit the first transparent substrater 201. As a result, acetone gradually infiltrates into the resist masks 227, 228 and 229 and the resist masks are reflowed. The area of the resist masks 227, 228 and 229 is expanded by reflowing each resist mask and as shown in FIG.19A, the resist masks 227 and 228 are reflowed to be a reflowed resist mask 233 in which adjacent parts are united and the area of the resist mask 229 is expanded by reflowing to be a reflowed resist mask 253.

As the viscosity is low in this reflowing, the reflowed resist mask 233 completely covers an ohmic contact layer 249, the source electrode 231, an ohmic layer 250 and the drain electrode 232 respectively formed by first etching and further, also covers a part of the surface of the a-Si film 224 under them. At a drain terminal, the resist mask 229 is expanded by reflowing to be a reflowed resist mask 253 and completely covers a drain terminal electrode 252 and an ohmic contact layer respectively formed by first etching. It is verified that in reflowing, distance between channels can be extended up to maximum 20 µm depending upon a processing condition.

To accelerate the reflowing of the resist mask, after a first etching process, oxygen plasma processing for removing an altered layer of the surface of the resist mask by the first etching can be also executed according to the already described method. Furthermore, processing for improving only the wettability of undercoating can be also executed before reflowing according to the already described method.

Figure 19B:
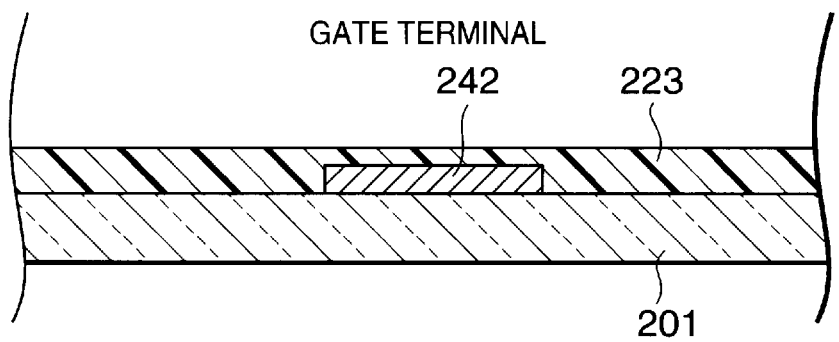
Figure 19C:
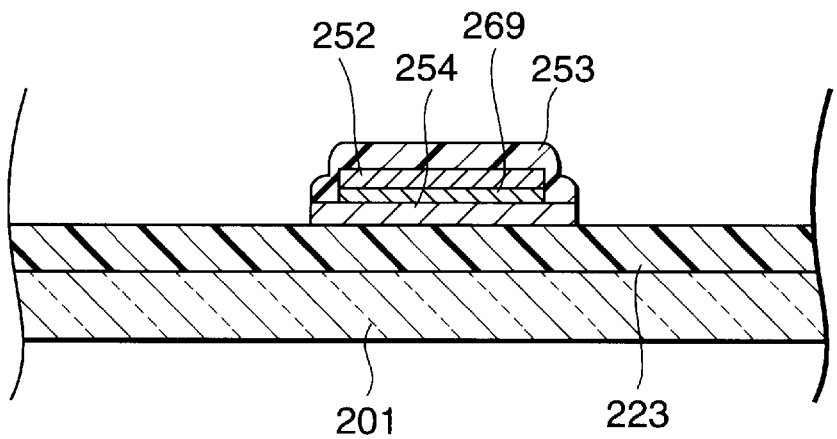
Figure 20A:
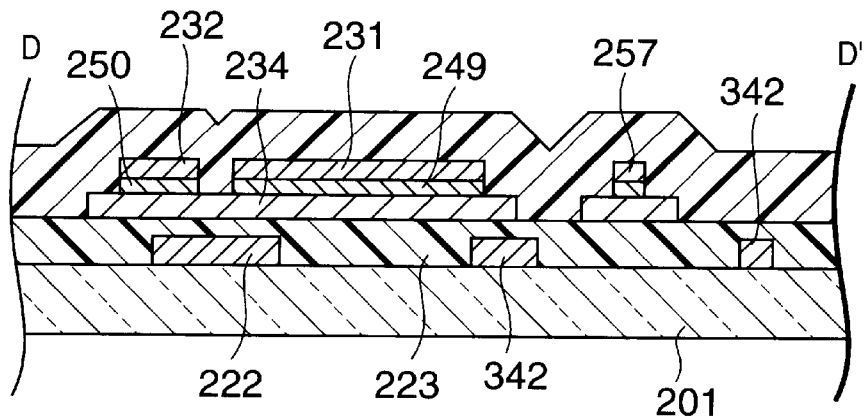
FIGS. 20A to 20C are schematic sectional views showing manufacturing processes following FIG. 19C.
Figure 20B:
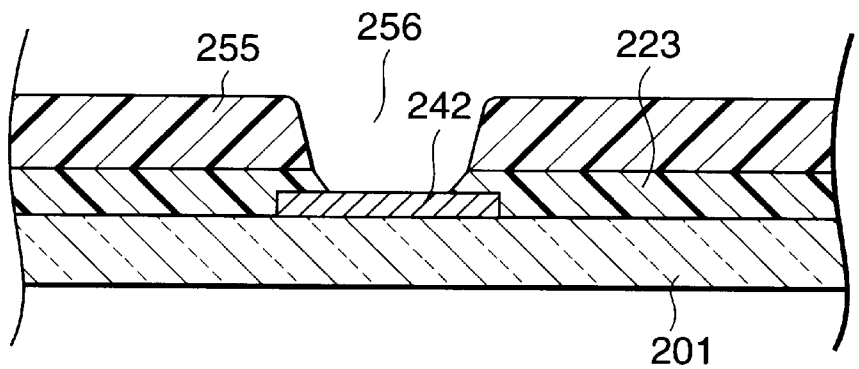
Figure 20C:
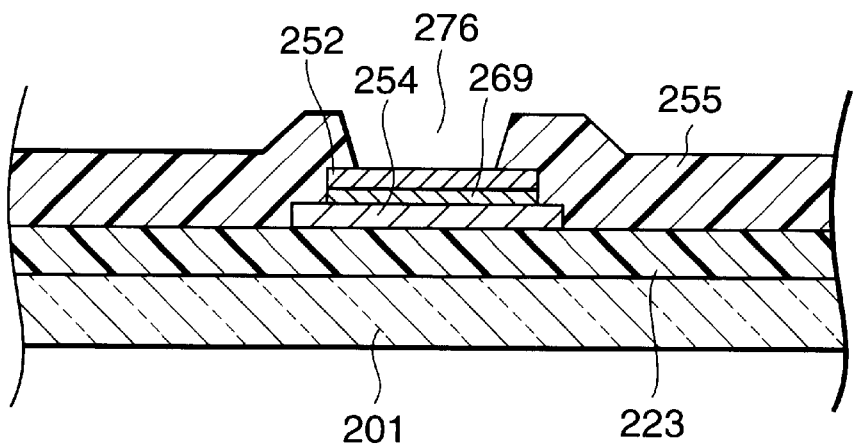

Next, second etching is applied to the a-Si film 224 using the reflowed resist masks 233 and 253 as an etching mask. As a result, island layers 234 and 254 are formed as shown in FIGS. 19A to 19C.

Next, the reflowed resist masks 233 and 253 are removed and after a passivation film 255 is formed, contact holes 256 and 276 are respectively formed at a gate terminal and the drain terminal by a photolithographic process and dry etching processing under conditions of $SF_6$/He gas=50/150 sccm, 10 Pa and 1000 W for 250 seconds. At the gate terminal, the contact hole 256 pierces the gate insulating film 223 and the passivation film 255 and at the drain terminal, the contact hole 276 pierces only the passivation film 255 (third process shown in FIGS. 20A to 20C).

Figure 21A:
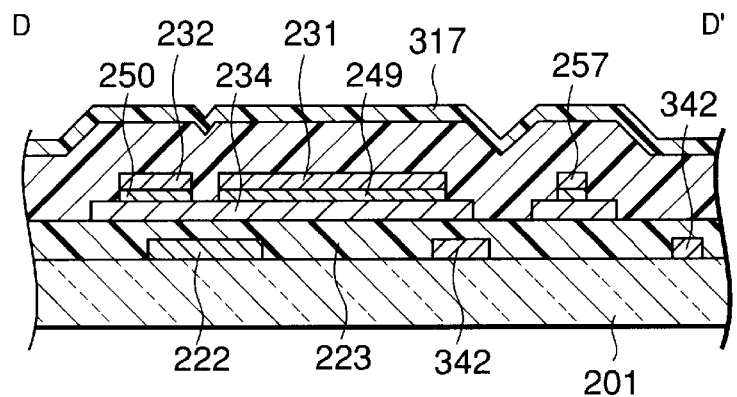
FIGS. 21A to 21C are schematic sectional views showing manufacturing processes following FIG. 20C.
Figure 21B:
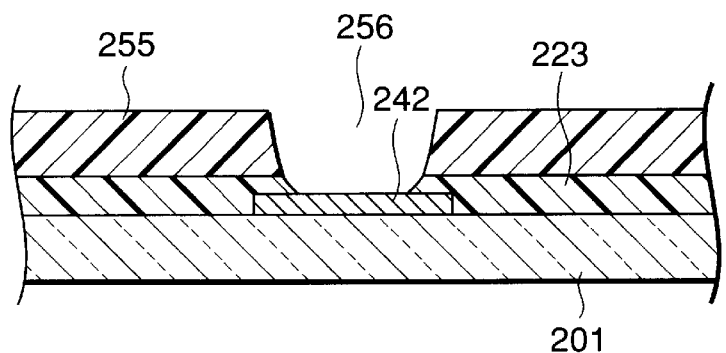
Figure 21C:
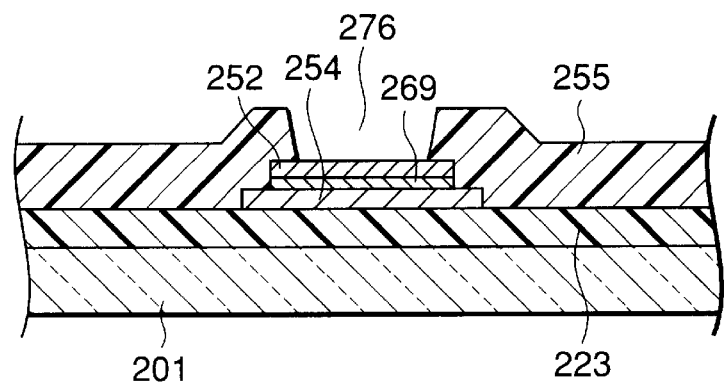

Next, the surface of a display except the terminal region is covered with an alignment layer 317 as shown in FIGS. 21. Or for another type, after a transparent metallic film made of ITO and others is formed so that the film covers the contact holes 256 and 276, a gate terminal transparent electrode 267 and a drain terminal transparent electrode 268 are formed by a photolithographic process and etchant of ferric chloride, wiring lead resistance at the terminal is reduced and the surface of the display except the terminal region is covered with the alignment layer 317 (fourth process shown in FIGS. 22A to 22C)

Figure 23A:
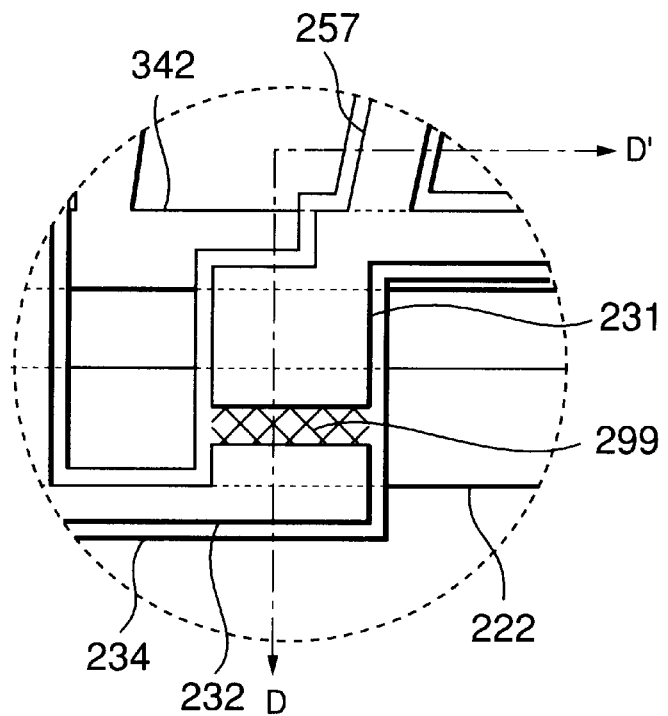
FIGS. 23A and 23B are an enlarged schematic plan and an enlarged schematic sectional view respectively showing the liquid crystal display equivalent to the sixth embodiment of the invention.
Figure 23B:
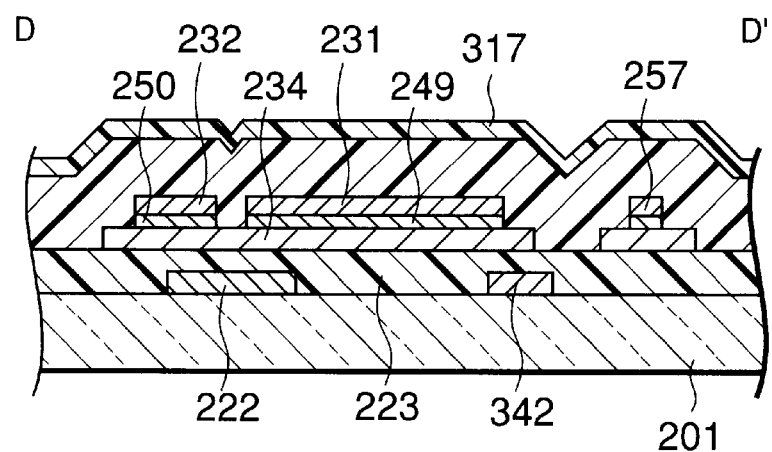

The invention is characterized in that two different mask patterns are formed in one process and etching is executed twice using the respective masks, however, as difference between the pattern formed by first etching and the pattern formed by second etching is not represented enough because the plan view in FIG. 16A is too minute, the enlarged plan view of a circular region surrounded by a broken line shown in FIG. 16A and a sectional view are shown in FIGS. 23A and 23B. FIG. 23B is a sectional view viewed along a cutting-plane line D–D' shown in FIG. 23A.

Figure 18A:
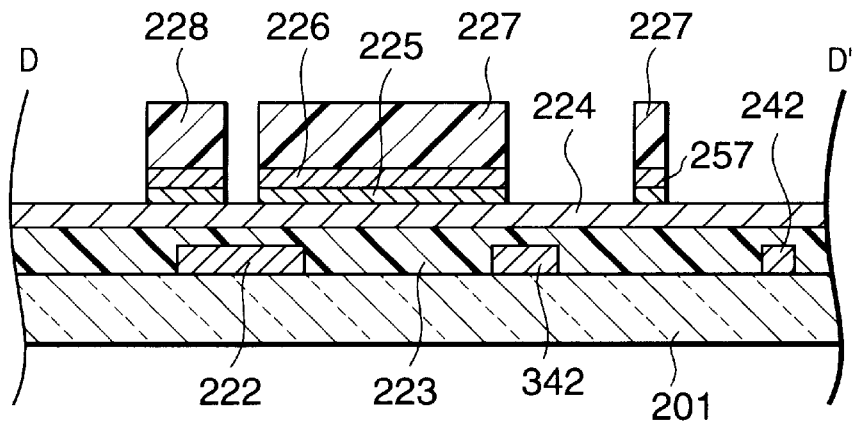
FIGS. 18A to 18C are schematic sectional views showing manufacturing processes following FIG. 17C.
Figure 18B:
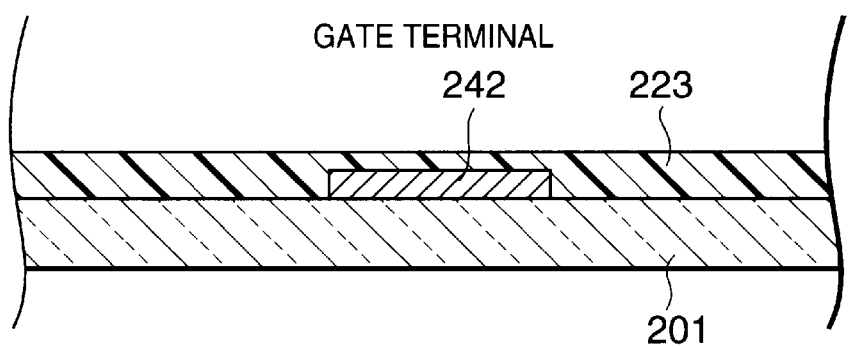
Figure 18C:
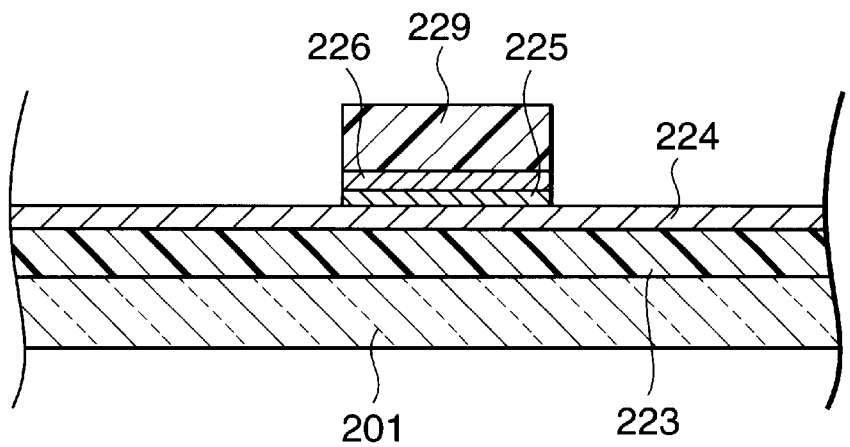

As shown in FIG. 23A, as the source electrode 232 and the drain electrode 231 and the ohmic layers under them are formed so that they are in the same shape by first etching and in second etching, the resist mask 227 and the resist mask 228 respectively shown in FIG. 18A in a channel region 299 between the source electrode 231 and the drain electrode 232 are connected by reflowing according to the invention shown in FIG. 19A to be the reflowed resist mask 233 shown in FIG. 19A, the channel region is completely covered with the resist mask 233. As the reflowed resist mask 233 covers the source electrode 231, the drain electrode 232 and the a-Si film 224 in the even width wider than the width of the source electrode 231 and the drain electrode 232 except the channel region 299, the island layer 234 is formed in the even width wider than the width of the source electrode 231 and the drain electrode 232 except the channel region at the same time as the channel region (a part of the island layer 234) of the a-Si film is formed by second etching. The island layer under the pixel electrode 257 (and the ohmic layer under the pixel electrode) naturally also has uniform width wider than the width of the pixel electrode 257.

In the sixth embodiment, the method of using one type of resist mask is described in relation to the manufacturing processes shown in FIGS. 18 and 19, however, it need hardly be said that the method of forming the resist mask in the fourth embodiment shown in FIGS. 8 and 9 and the method of forming the resist mask in the fifth embodiment shown in FIGS. 12 to 14 may be also applied for forming the island layer in this embodiment.

Figure 22A:
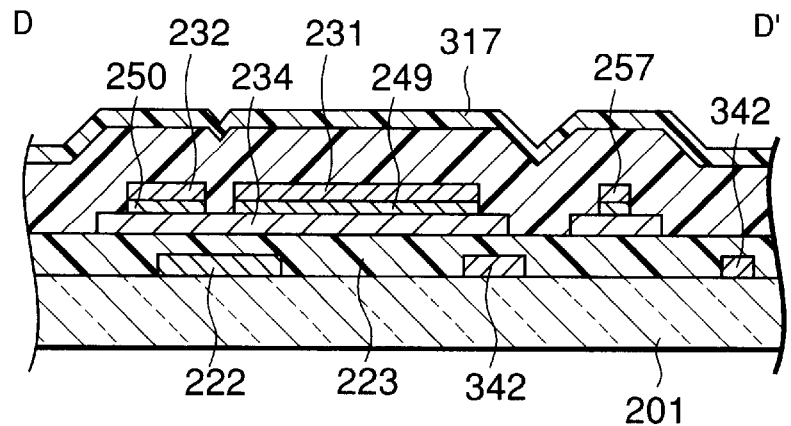
FIGS. 22A to 22C are schematic sectional views showing manufacturing processes different from those shown in FIGS. 21A to 21C following FIGS. 20A to 20C.
Figure 22B:
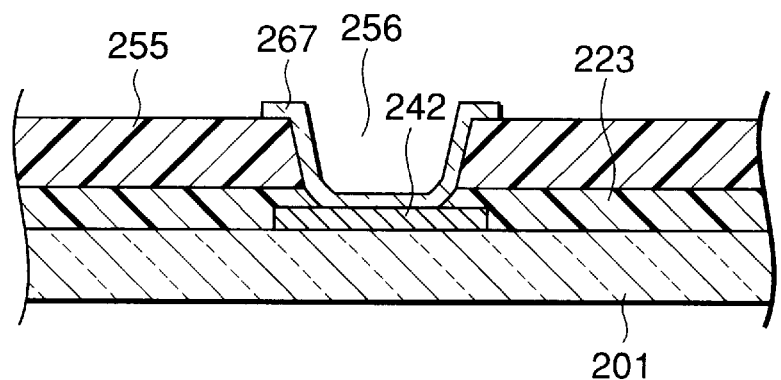
Figure 22C:
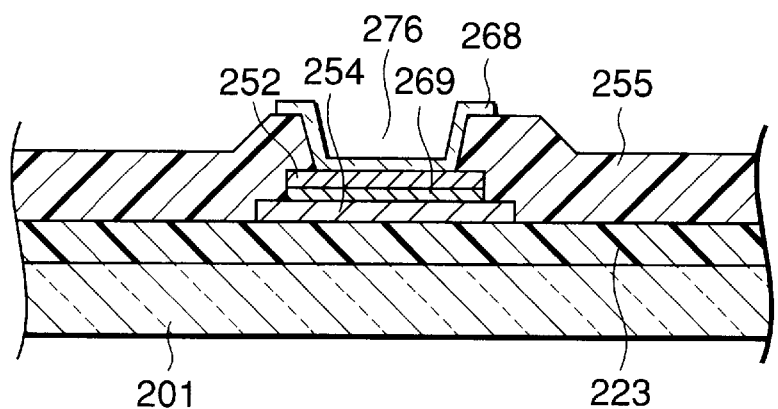

As described above, the active matrix of the horizontal-type field-effect liquid crystal display can be formed, however, one process is not required for the process shown in FIGS. 19A to 19C according to the manufacturing method according to the invention though one process is required for the process in the conventional manufacturing method. Therefore, according to the manufacturing method according to the invention, only four processes are required while five processes are required in the conventional manufacturing method. Furthermore, if the process for forming the terminal electrode by the transparent metallic film shown in FIGS. 22A to 22C is omitted, the active matrix of the horizontal-type field-effect liquid crystal display can be manufactured in three processes and the effect of reducing the manufacturing cost is further enhanced.

Finally, when a polarizing plate 210 is attached to the back of the first transparent substrate 201 (the surface on which no TFT is formed of the first transparent substrate 201 is called the back), TFT of the horizontal-type field-effect liquid crystal display is completed as shown in FIG. 16B.

In the liquid crystal display, color is displayed by making light 356 incident from the back of the first transparent substrate 201 as shown in FIG. 16B and irradiating a color filter (hereinafter called CF) substrate 300 opposite to TFT 200.

In the meantime, the CF substrate 300 is formed as follows.

First, the color filter is provided with a second transparent substrate 301 made of transparent insulating material such as glass, a black matrix 311, a color layer 313 and a second insulating film 314 made of silicon nitride (SiNx) and others respectively on one surface of the second transparent substrate 301 and a conductive film 315 and a polarizing plate 316 respectively on the other surface of the second transparent substrate 301, and an alignment layer 343 is formed on the surface of the uppermost layer of the substrate by a method such as offset printing.

The alignment layer of TFT 200 and the color filter 300 respectively acquired as described above is rubbed, molecules in the alignment layer are oriented in a predetermined direction, cell gap material is put between the two substrates so that they are apart by a predetermined interval and a liquid crystal 318 is sealed in the gap.

An interval between the comb-type pixel electrode 257 that effectively generates an electric field in a lateral direction on the surface of the TFT 200 and the common electrode 342 is set to approximately 7 µm.

The thickness of the polarizing plate 210 and the polarizing plate 316 is set to approximately 0.2 mm. The thickness of the conductive film 315 is set to approximately 50 nm. The thickness of the first transparent substrate and the second transparent substrate is set to approximately 0.7 mm. The thickness of the black matrix 311 is set to approximately 1 µm. The thickness of the color layer 313 is set to approximately 1 µm. The thickness of the second insulating film 314 is set to approximately 1 µm. The thickness of the alignment layer is set to approximately 50 nm. The thickness of the gate insulating film 223 is set to approximately 500 nm. The thickness of the passivation film 255 is set to approximately 300 nm. The thickness of the common electrode 342 is set to approximately 400 nm. The thickness (the cell gap) of the liquid crystal 318 is set to 4.5 μm and cell spacers are arranged at suitable dispersion density.

A liquid crystal panel acquired as described above can perform full color display from black to white by matching the transmission axis of the polarizing plate 210 of TFT 200 to the orientation of a liquid crystal defined depending upon a rubbing method, bonding the polarizing plate 316 the absorption axis of which is made perpendicular to TFT 200 to the color filter 300, radiating light 356 from the side of TFT 200 and applying electric potential difference freely between the pixel electrode 257 and the common electrode 342.

The embodiments of the invention are described above, however, the invention is not limited to the embodiments and includes various embodiments or a transformed example of the embodiments.

First, to form the ohmic contact layer in each embodiment by the etching of the N+-type a-Si film in the second to six embodiments of the invention, only the metallic film is first etched using the resist mask not immediately after the etching of the metallic film for the source electrode and the drain electrode in this embodiment but before reflowing as a mask, afterward, the N+-type a-Si film and the a-Si film are etched using the reflowed resist mask as a mask and the island layer may be also laminated by the a-Si film and the N+-type a-Si film. Afterward, the island layer made of the a-Si film may be also formed by etching only the N+-type a-Si film of the laminated film using the drain electrode and the source electrode as a mask after the reflowed resist mask is peeled. This case has a merit that reflowing is simple because difference in a level between patterns in reflowing is small and the alteration of the surface by etching is small, compared with the case described above.

In the second to sixth embodiments of the invention, reflowing the resist m ask is enabled by exposing each resist mask to the vapor of an organic solvent for 1 to 3 minutes and gradually infiltrating the organic solvent into the resist mask, however, the invention is not limited to this method. For another method, there are the method of exposing to the vapor of a chemical. (that is, solution including at least one of the solution of an organic solvent, alkaline solution and acid solution) and the method of dipping in an extremely dilute (for example, 1/100 to 1/1000) concentration of chemical (that is, solution including at least one of the solution of an organic solvent, alkaline solution and acid solution) respectively already described in the first embodiment of the invention. However, in dipping in an extremely dilute concentration of chemical (that is, solution including at least one of the solution of an organic solvent, alkaline solution and acid solution), as resist is dissolved in the above chemical and peeled when the concentration of the above chemical is high, the concentration of the chemical in the solution is required to be regulated so that the concentration is extremely dilute without causing dissolution and peeling and in addition, so that a part of the chemical infiltrates into the resist. For an organic solvent used for the solution of an organic solvent of the chemical, the organic solvents already describe in the first embodiment of the invention (that is, alcohols (R—OH), ethers (R—O—R, Ar—O—R, Ar—O—Ar), esters, ketones and glycol ethers, a concrete example of the organic solvents and a mixed solvent) can be used.

The resist mask described in the third to sixth embodiments may be also formed by either of negative or positive resist.

Furthermore, in addition to the methods described in the invention, the fine control of a desired etching pattern is also enabled by readjusting the size of the expansion of the resist mask and etching because the area of the resist mask is reduced by removing a part extra reflowed and expanded of the resist mask when $O_2$ ashing processing and UV ozone processing for example are performed for the resist mask after the resist mask is reflowed. In addition to the methods described in the invention, if a method of reflowing the resist mask further again and etching again is used after the resist mask is reflowed by etching and etched, the patterning of a complex shape is also enabled.

To further accelerate the reflowing of the resist mask described in the third to sixth embodiments, after the first etching process, oxygen plasma processing is executed in plasma having RF power of 1000 W at the flow rate of $O_2$ of 300 sccm under 10 to 200 Pa for 100 seconds to remove an altered layer of the surface of the resist mask by first etching. Or UV ozone processing is executed by heating the substrate at 100 to 200° C. and radiating UV radiation in the atmosphere of ozone gas. The altered resist superficial layer is removed by the processing and uniform reflowing small in difference between the inside and the outside occurs.

The oxygen plasma processing and the UV ozone processing also have effect that the wettability of the surface of the film uncoated with resist is improved and also have effect that the reflowing of the surface of the film is facilitated by fused resist. A processing method and a condition at this time are selected if necessary by measuring the ratio of the removal of an altered layer of the surface of resist and the ratio of the improvement of the wettability of the surface of the film reflowed by a chemical.

In the fourth conventional example (the method utilizing the swelling of the volume by sililation), even if resist is expanded up to 0.1 to 2.0 μm sideways utilizing the swelling of the volume, no problem occurs and in the formation in the channel of approximately 5 μm further wider, the problem of adhesion occurs, however, in the third, fourth and fifth embodiments of the invention, even if the channel is 20 μm wide, the adhesion strength is satisfactory, in the formation in the channel of approximately 5 μm, no problem occurs and the problem of the third conventional example can be completely solved.

In case the metallic film, the gate electrode, the source electrode, the drain electrode, the common electrode and the pixel electrode described in the first to sixth embodiments of the invention are formed by an ITO film, a transparent conductive film, an indium-tin alloy, one-layer structure made of aluminum or an aluminum alloy, one-layer structure made of chromium or a chromium alloy, two-layer structure made of aluminum or an aluminum alloy and chromium or a chromium alloy, two-layer structure made of aluminum or an aluminum alloy and titanium or a titanium alloy, two-layer structure made of aluminum or an aluminum alloy and titanium nitride or a titanium nitride alloy, two-layer structure made of aluminum or an aluminum alloy and molybdenum or a molybdenum alloy, two-layer structure made of chromium or a chromium alloy and molybdenum or a molybdenum alloy, three-layer structure made of chromium or a chromium alloy, aluminum or an aluminum alloy and chromium or a chromium alloy, three-layer structure made of molybdenum or a molybdenum alloy, aluminum or an aluminum alloy and molybdenum or a molybdenum alloy, three-layer structure made of aluminum or an aluminum alloy, molybdenum or a molybdenum alloy and chromium or a chromium alloy, three-layer structure made of aluminum or an aluminum alloy, molybdenum or a molybdenum alloy and titanium or a titanium alloy or three-layer structure made of aluminum or an aluminum alloy, titanium nitride or a titanium nitride alloy and titanium or a titanium alloy, a prototype is actually produced, it is verified that the pattern is formed without a problem even if these processes are applied and they are suitable material in this pattern formation method.

For an example of the thickness of the metallic layer, the thickness of the single layer made of Cr is set to 150 nm, the respective thickness of the layers made of Cr and Al is set to 100 nm and 150 nm, the respective thickness of the layers made of Ti, TiN and Al is set to 50 nm, 50 nm and 150 nm, the respective thickness of the layers made of Ti, Al and Ti is set to 50 nm, 150 nm and 150 nm, and the respective thickness of the layers made of TiN, Al and TiN is set to 50 nm, 150 nm and 150 nm.

In the third, fourth and fifth embodiments of the invention, the formation methods of the reverse staggered-type TFT pattern are described, however, the pattern formation method according to the invention is not limited to this and the formation method of a TFT pattern provided with a color filter wherein a color filter layer is formed under a pixel electrode or a flattened film and a color filter layer are formed out of the formation method of the TFT pattern can be also executed.

Finally, the pattern formation methods described in the first to sixth embodiments of the invention are used for the manufacturing method in the manufacturing process of a liquid crystal display (LCD) having a flat display panel, an electroluminescent display (EL), a field-emission display (FED), a fluorescent character display, an active device having a plasma display panel (PDP) or a substrate provided with an integrated circuit for example.

In the above description, the glass substrate is used for a substrate, however, a substrate to which the invention can be applied is not limited to this and the invention can be also applied to base material such as a nitride film substrate and an aluminum nitride substrate and a semiconductor substrate such as a silicon substrate.

As described above, in the pattern formation methods according to the invention, the resist mask used once as an etching mask in the manufacturing process of a semiconductor device is reflowed, the dimension of the resist mask is swollen keeping the volume before reflowing and the resist mask is changed into another etching mask. Hereby, the pattern of wiring and others is easily tapered. As two or more types of patterns can be formed on the etched film in one lithographic process, the manufacturing process can be also reduced.

What is claimed is:

1. A pattern formation method, comprising the steps of:
    forming an organic film having a predetermined pattern on an etched film;
    removing a part of the etched film from the surface using the organic film as a mask so that the etched film has an exposed region and a coated region coated with the organic film;
    extending the organic film up to the exposed region by transforming the organic film by infiltrating the solution of an organic solvent into the organic film and reflowing the organic film; and
    etching the exposed region of the etched film using a transformed organic film as a mask.

2. A pattern formation method according to claim 1, wherein:
    in the process for forming the organic film, an adjacent organic film adjacent to the organic film is formed; and
    in the process for forming the transformed organic film, the adjacent organic film becomes an adjacent transformed organic film and is united with the transformed organic film.

3. A pattern formation method according to claim 1, wherein:
    a process for removing a part of the transformed organic film is included between the process for forming the transformed organic film and the process for etching the exposed region of the etched film.

4. A pattern formation method according to claim 3, wherein:
    the process for removing a part of the transformed organic film is executed by reducing the area of the transformed organic film by either of ashing processing in which oxygen is applied to the transformed organic film or ozone processing using ultraviolet radiation.

5. A pattern formation method according to claim 1, wherein:
    processes from the process for forming the transformed organic film to the process for etching the exposed region of the etched film are repeated at least once after the process for etching the exposed region of the etched film.

6. A pattern formation method according to claim 1, wherein:
    at least final etching out of the etching of the etched film is wet etching.

7. A pattern formation method according to claim 1, wherein:
    the solution of the organic solvent includes at least one of the following organic solvents (R: alkyl group or substitutional alkyl group, Ar: phenyl radical or aromatic nucleus except phenyl radical):
    Alcohols (R—OH)
    Alkoxy alcohols
    Ethers (R—Q—R, Ar—O—R, Ar—O—Ar)
    Esters
    Ketones
    Glycols
    Alkylene glycols
    Glycol ethers.

8. A pattern formation method according to claim 1, wherein:
    the organic film has plural regions different in the thickness.

9. A pattern formation method according to claim 8, wherein:
    the organic film is composed of plural organic films different in the thickness; and
    a process for etching the organic film, removing a relatively thin organic film forming the organic film out of the plural organic films different in the thickness and leaving an organic film thicker than the relatively thin organic film is included between the process for removing a part of the etched film from the surface using the organic film as a mask so that the etched film has an exposed region and a coated region coated with the organic film and the process for transforming the organic film and extending it to the exposed region.

10. A pattern formation method according to claim 1, wherein:
    a process for removing an altered layer of the surface of the organic film is included between the process for removing a part of the etched film from the surface using the organic film as a mask so that the etched film has an exposed region and a coated region coated with the organic film and the process for transforming the organic film and extending it to the exposed region.

11. A pattern formation method according to claim 1, wherein:
the etched film is composed of a first film and a second film in order from the bottom;
the second film is etched and removed using the organic film as a mask; and
the first film is etched and removed using the transformed organic film as a mask.

12. A pattern formation method according to claim 11, wherein:
the first film is a first metallic film; and
the second film is a second metallic film made of material different from that of the first metallic film.

13. A pattern formation method according to claim 11, wherein:
the first film is a silicon film; and
the second film is a silicon film for an ohmic contact including high-density impurities and a metallic film in order from the bottom.

14. A manufacturing method of TFT for a display, comprising the steps of:
forming a gate electrode on a substrate;
sequentially forming a gate insulating film, a semiconductor layer and a metallic layer so that they cover the gate electrode;
patterning the metallic layer and forming a mask for forming a source electrode and a drain electrode;
infiltrating an organic solvent into the mask after the metallic layer is patterned, reflowing the mask and connecting the masks located between the source electrode and the drain electrode; and
patterning the semiconductor layer using the connected mask acquired in the process for connecting the masks.

15. A manufacturing method of TFT for a display according to claim 14, wherein:
a process for forming an ohmic layer between the metallic layer and the semiconductor layer is provided; and
in the process for patterning the metallic layer, the ohmic layer is also patterned.

16. A manufacturing method of TFT for a display according to claim 14, wherein:
a process for forming an ohmic layer between the metallic layer and the semiconductor layer is provided;
in the process for patterning the semiconductor layer, the ohmic layer is also patterned; and
after the connected mask is removed, the ohmic layer is patterned using the source electrode and the drain electrode as a mask.

17. A manufacturing method of TFT for a display according to claim 14, wherein:
when the gate electrode is formed, a common electrode is also formed on the substrate;
further, the gate insulating film, the semiconductor layer and the metallic layer are sequentially formed so that the common electrode is covered in the process for sequentially forming the gate insulating film, the semiconductor layer and the metallic layer; and
a pixel electrode located over the common electrode is formed in the process for patterning the metallic layer and forming the source electrode and the drain electrode.

18. A manufacturing method of TFT for a display according to claim 14, wherein:
the masks adjacent so that they respectively correspond to the source electrode and the drain electrode have a thin film region in which the mask is thinner on the separate sides than the mask on the adjacent sides.

19. A manufacturing method of TFT for a display according to claim 18, wherein:
the thin film region is removed before the connected mask is formed.

20. A manufacturing method of TFT for a display according to claim 17, wherein:
the display is a liquid crystal display.

* * * * *